(12) United States Patent
Darwish et al.

(10) Patent No.: US 8,330,213 B2
(45) Date of Patent: Dec. 11, 2012

(54) POWER SEMICONDUCTOR DEVICES, METHODS, AND STRUCTURES WITH EMBEDDED DIELECTRIC LAYERS CONTAINING PERMANENT CHARGES

(75) Inventors: Mohamed N. Darwish, Campbell, CA (US); Jun Zeng, Torrance, CA (US); Richard A. Blanchard, Los Altos, CA (US)

(73) Assignee: MaxPower Semiconductor, Inc., Santa Clara, CA (US)

(*) Notice: Subject to any disclaimer, the term of this patent is extended or adjusted under 35 U.S.C. 154(b) by 138 days.

(21) Appl. No.: 12/759,696

(22) Filed: Apr. 13, 2010

(65) Prior Publication Data

US 2011/0079843 A1 Apr. 7, 2011

Related U.S. Application Data

(60) Provisional application No. 61/168,794, filed on Apr. 13, 2009.

(51) Int. Cl.
*H01L 29/423* (2006.01)

(52) U.S. Cl. . 257/330; 257/492; 257/493; 257/E29.012; 257/E29.201

(58) Field of Classification Search .......... 257/330, 257/492, 493, E29.012, E29.201
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 2001/0041407 A1 | 11/2001 | Brown | |
| 2003/0203576 A1 | 10/2003 | Kitada et al. | |
| 2006/0060916 A1 | 3/2006 | Girdhar et al. | |
| 2007/0272957 A1 | 11/2007 | Johnson et al. | |
| 2008/0048257 A1 | 2/2008 | De Fresart et al. | |
| 2008/0067586 A1 | 3/2008 | Williams et al. | |
| 2010/0258854 A1* | 10/2010 | Tokano et al. | 257/328 |

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

*Primary Examiner* — Minh-Loan T Tran
(74) *Attorney, Agent, or Firm* — Robert O. Groover, III; Groover & Associates PLLC

(57) ABSTRACT

Power devices using refilled trenches with permanent charge at or near their sidewalls. These trenches extend vertically into a drift region.

41 Claims, 40 Drawing Sheets

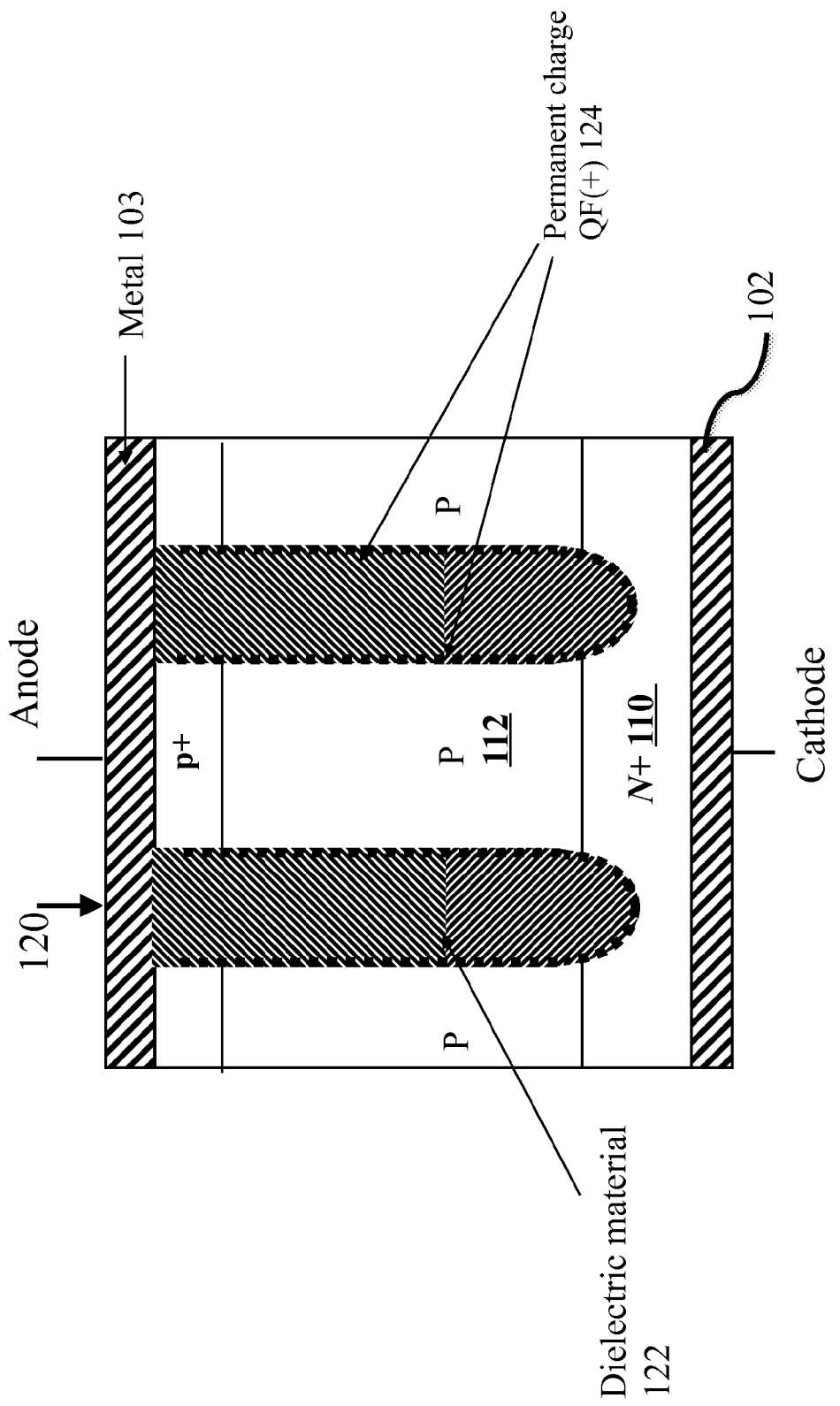
Figure 1: Diode with trench filled dielectric material containing permanent charge (Prior Art)

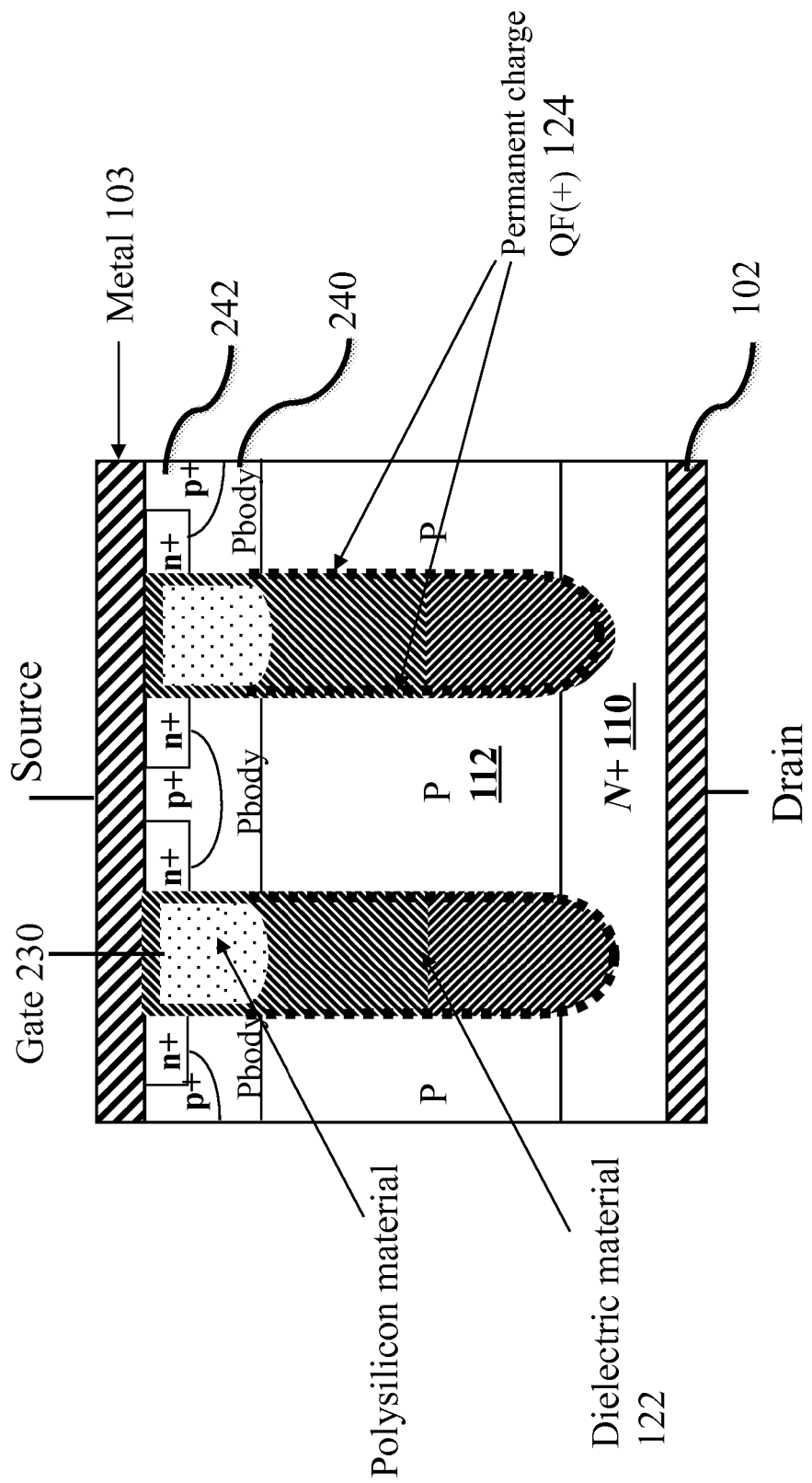
Figure 2: MOS transistor with trench filled dielectric material containing permanent charge (Prior Art)

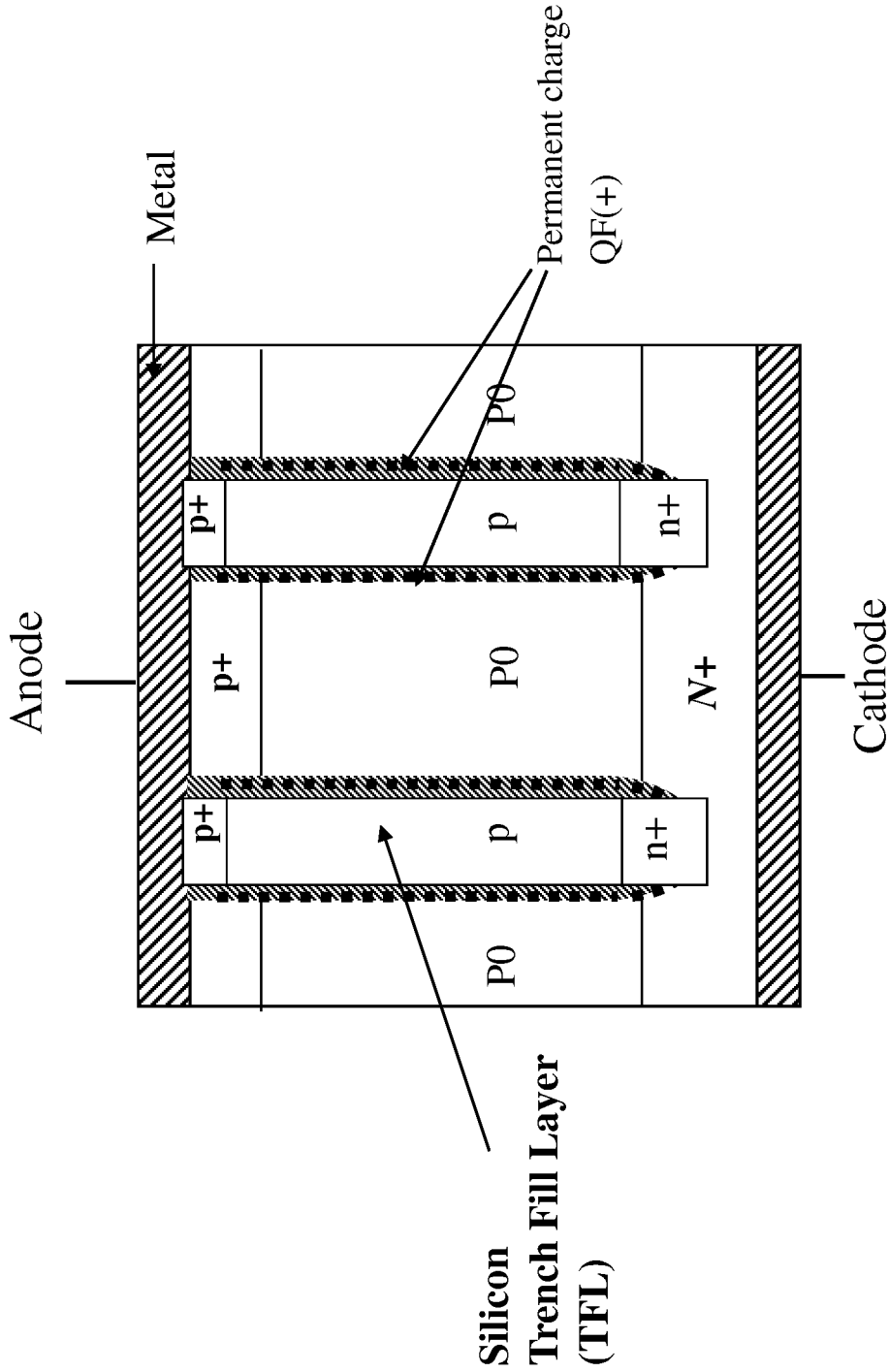
Figure 3(a): Diode or voltage blocking structure with trenches filled with silicon layer and dielectric material containing permanent charge

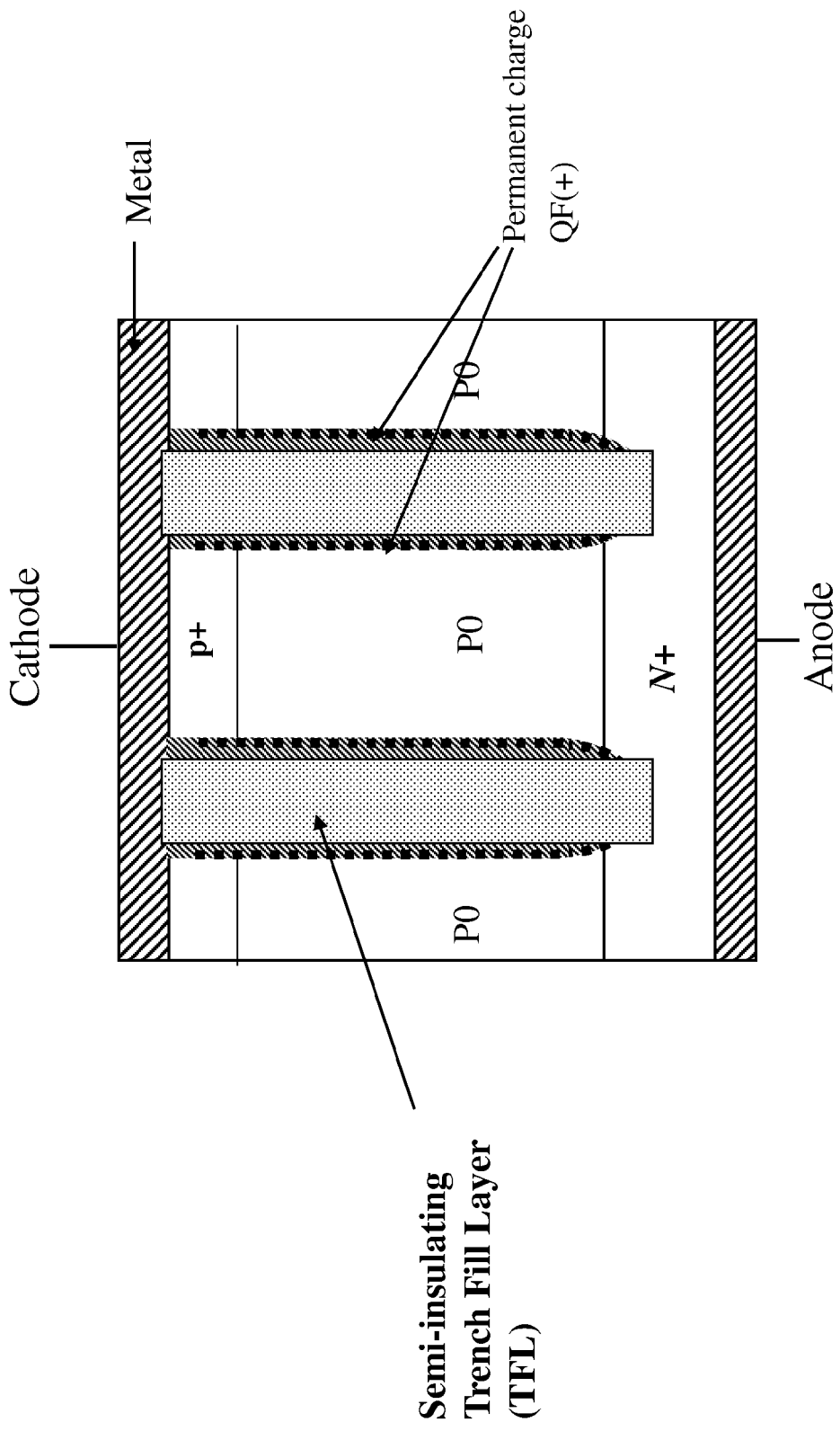
Figure 3(b): Diode structure with trenches filled with semi-insulating layer and dielectric material containing permanent charge

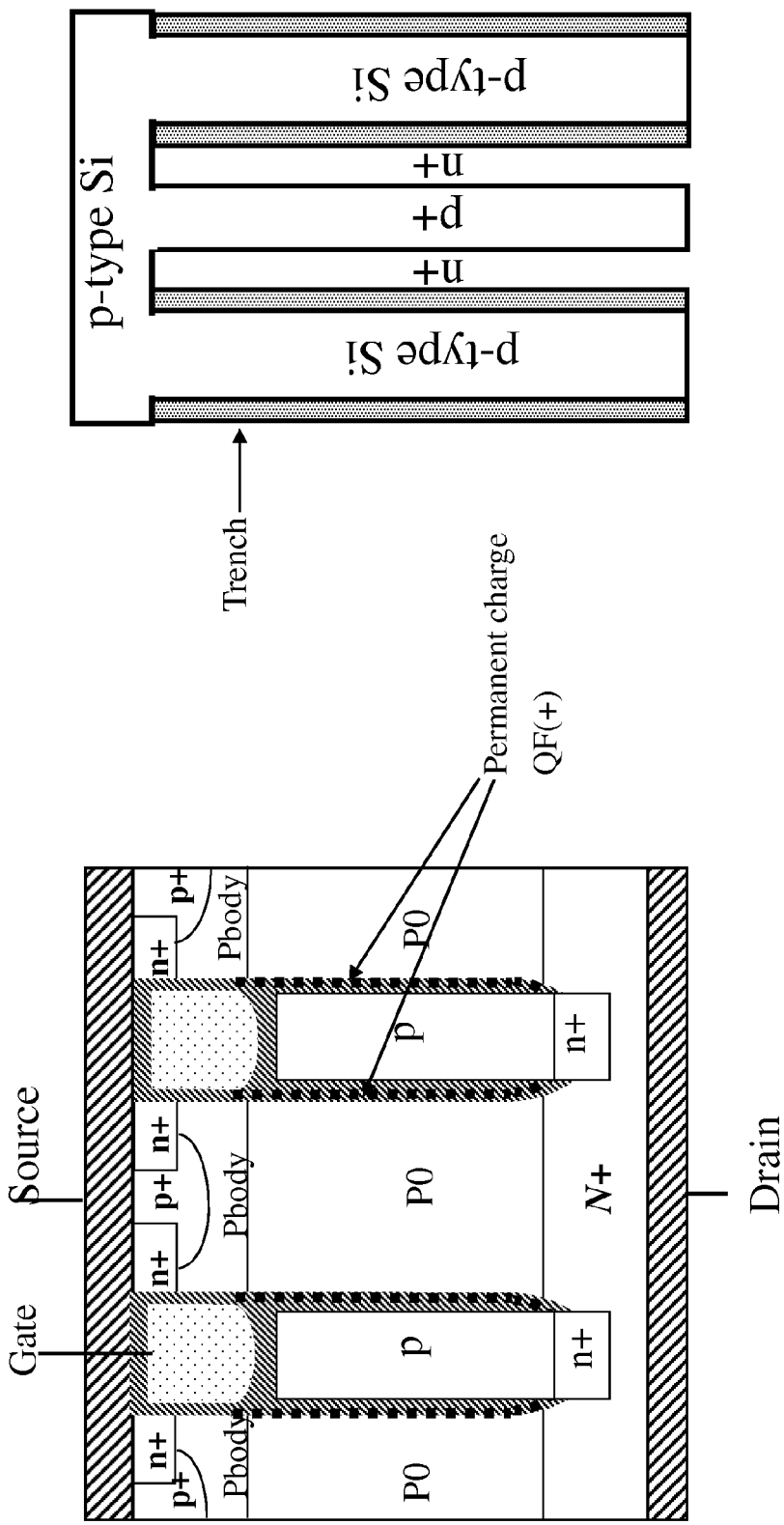

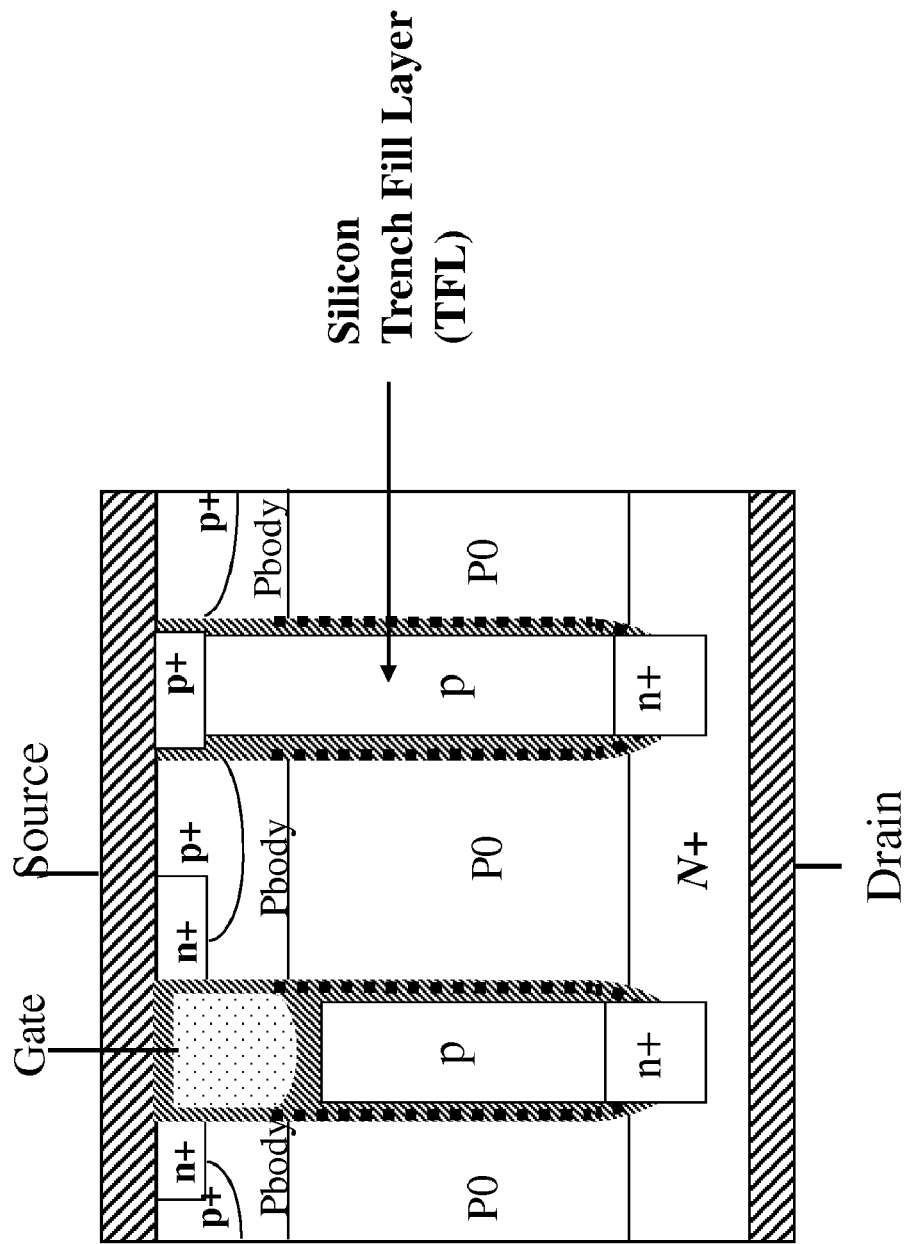
Figure 4(b): MOS transistor with trenches filled with silicon layer and dielectric material containing permanent charge

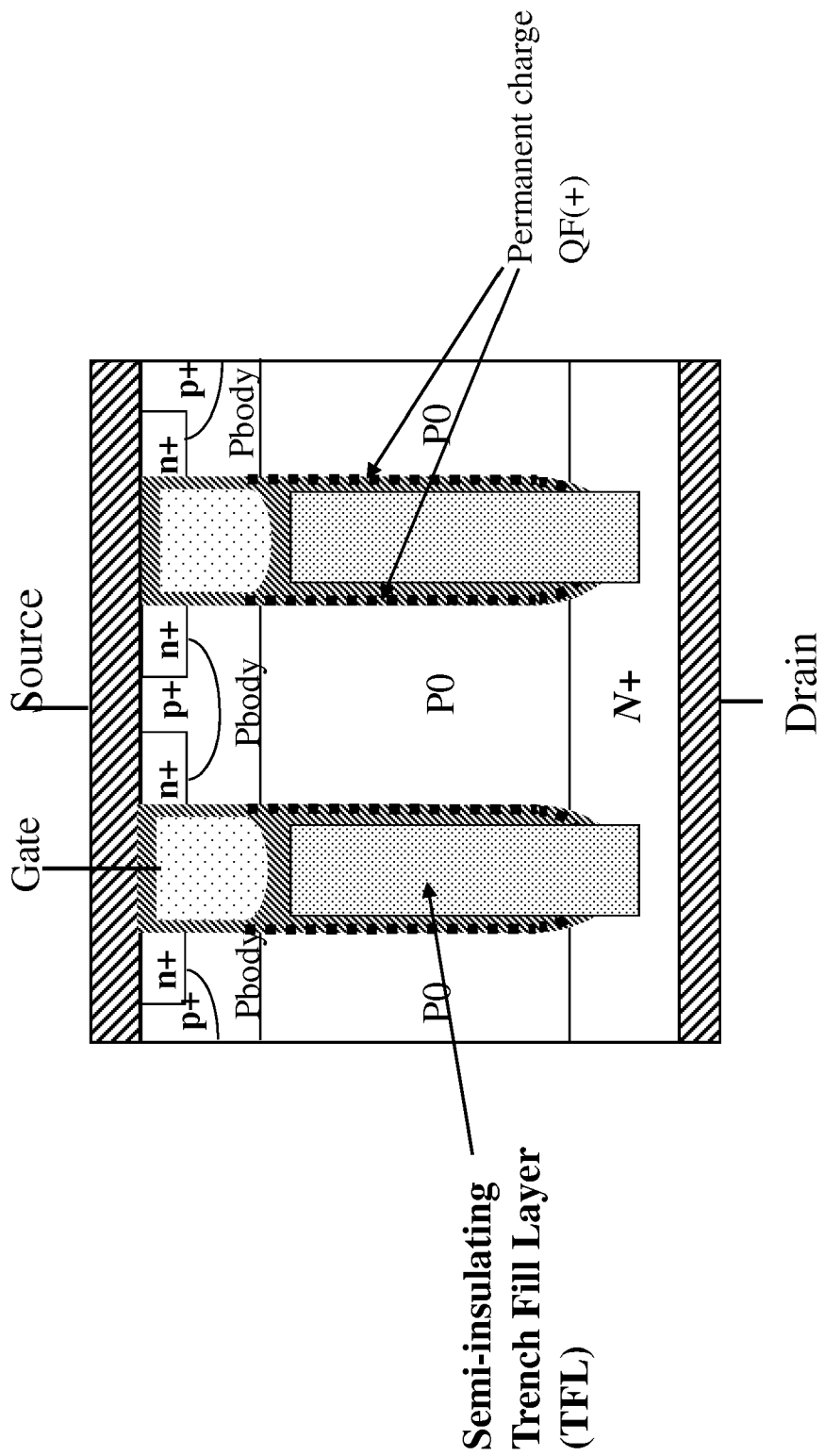
Figure 4(c): MOS transistor with trench filled with semi-insulating layer and dielectric material containing permanent charge

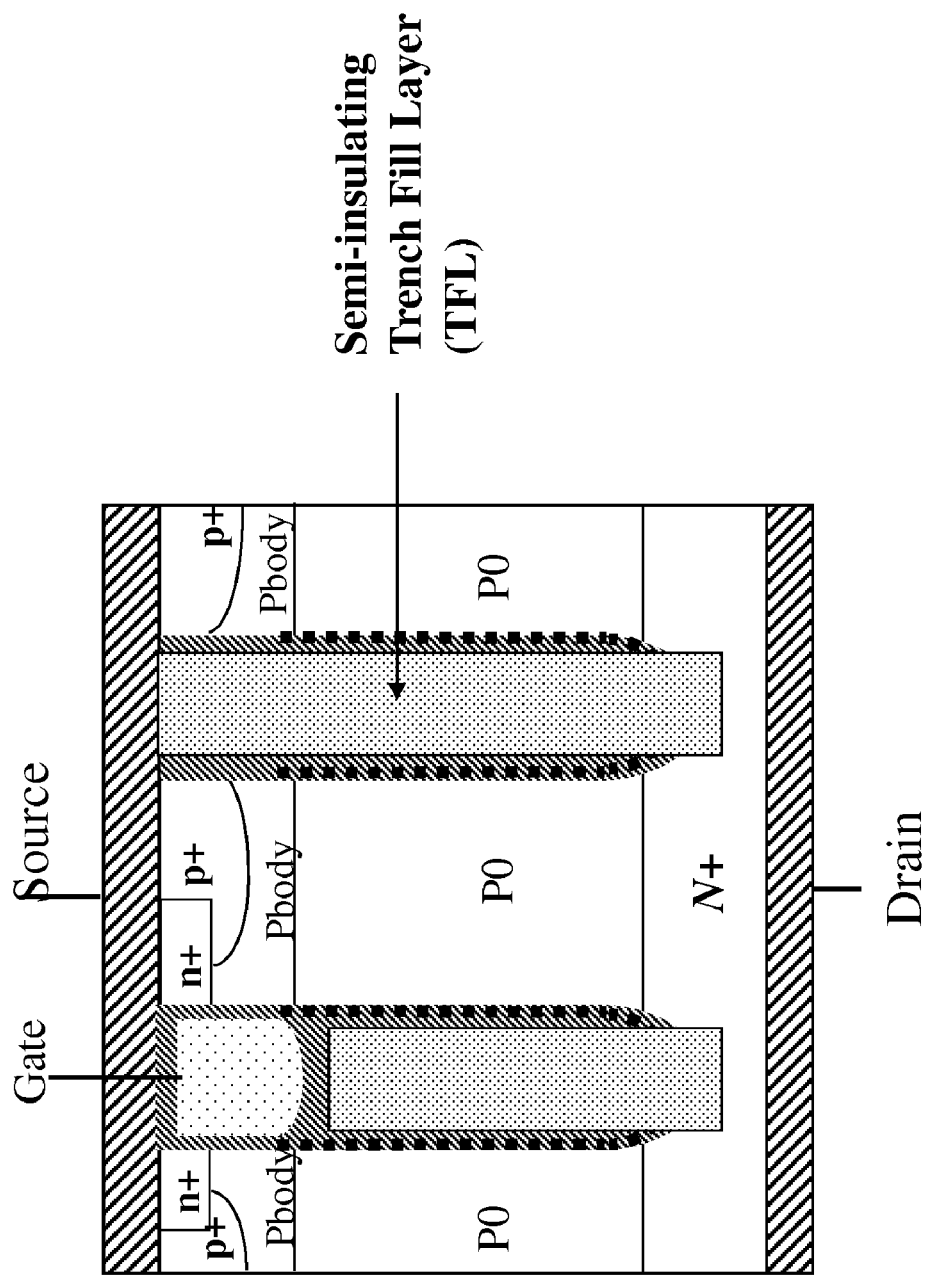
Figure 4(d): MOS transistor with trenches filled semi-insulating layer and dielectric material containing permanent charge

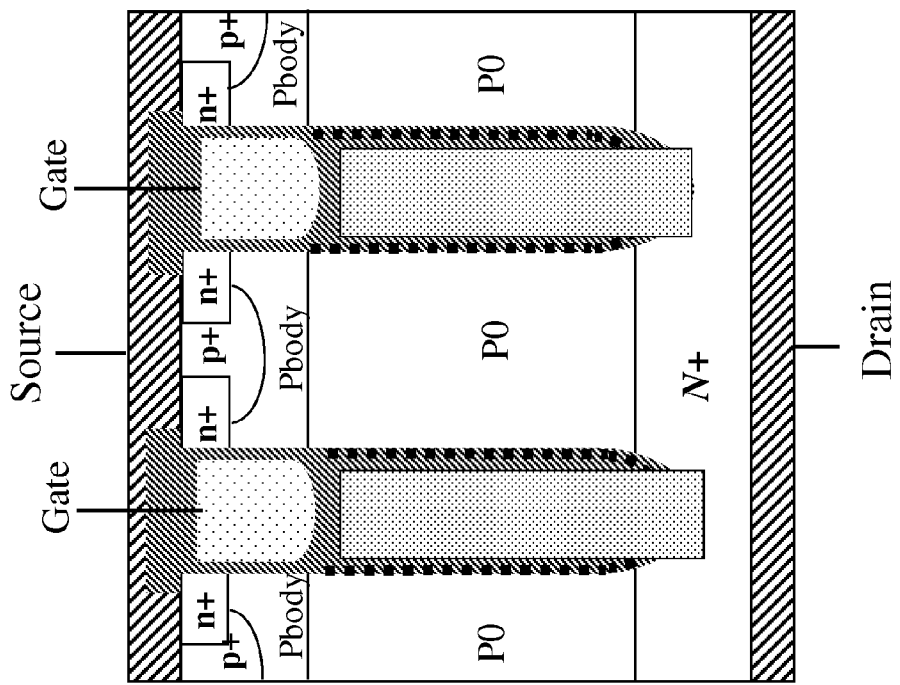
Figure 5(b): A trench MOS transistor similar to that shown in figure 4(c) but with dielectric layer above trenches
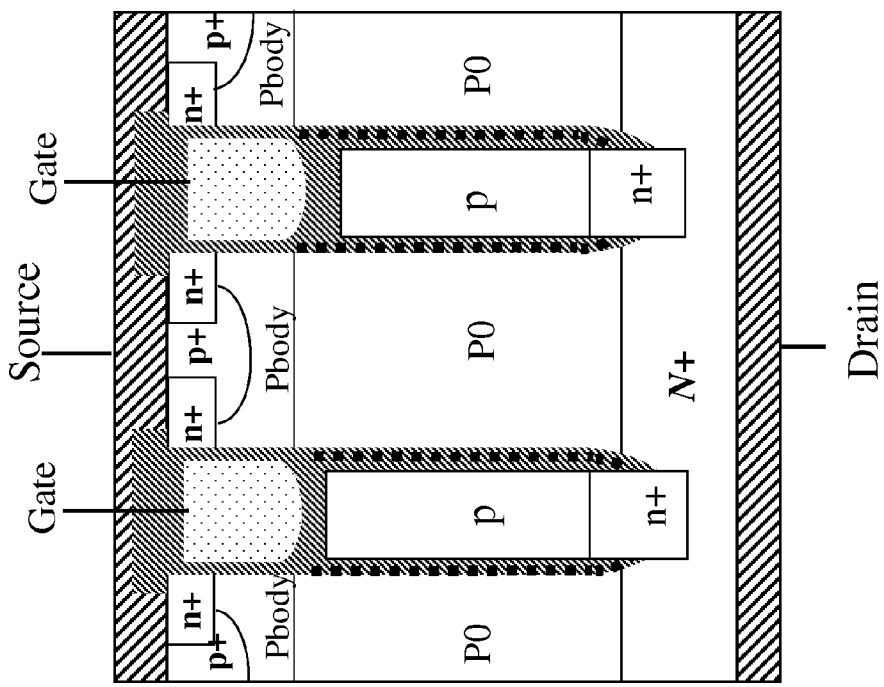
Figure 5(a): A trench MOS transistor similar to that shown in figure 4(a) but with trench dielectric layer above silicon surface.

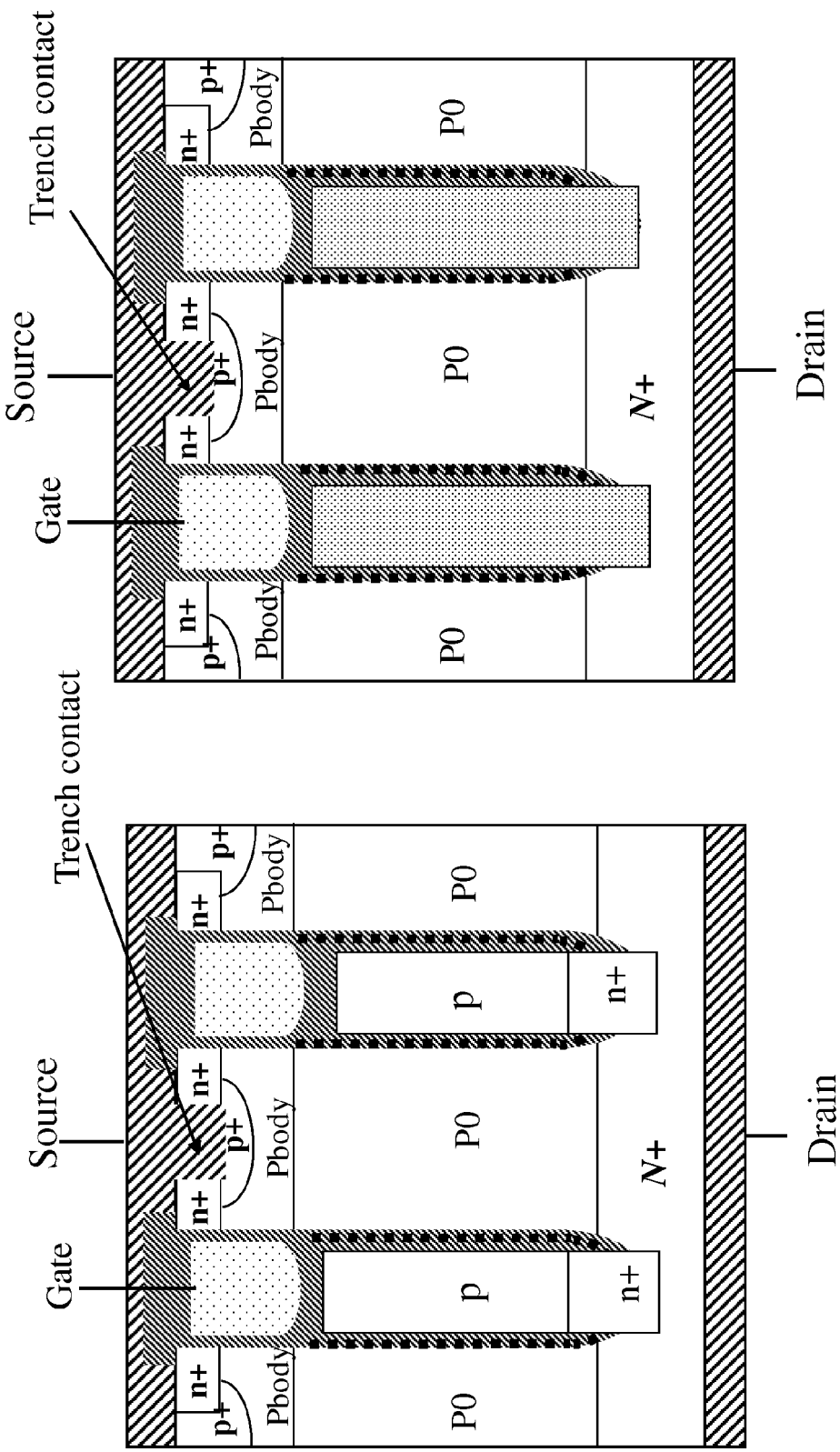
Figure 5(d): A trench MOS transistor similar to that shown in figure 5(b) but with a trench source contact.
Figure 5(c): A trench MOS transistor similar to that shown in figure 5(a) but with trench source contact.

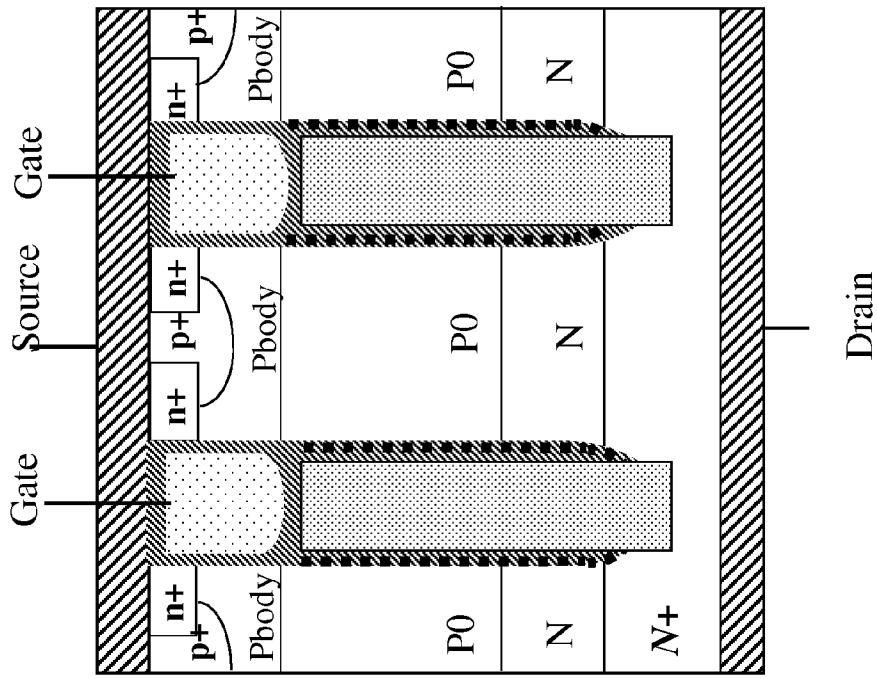
Figure 6(b): A trench MOS transistor similar to that shown in figure 4(c) but with a N-drift region provided on top of the N+ substrate.
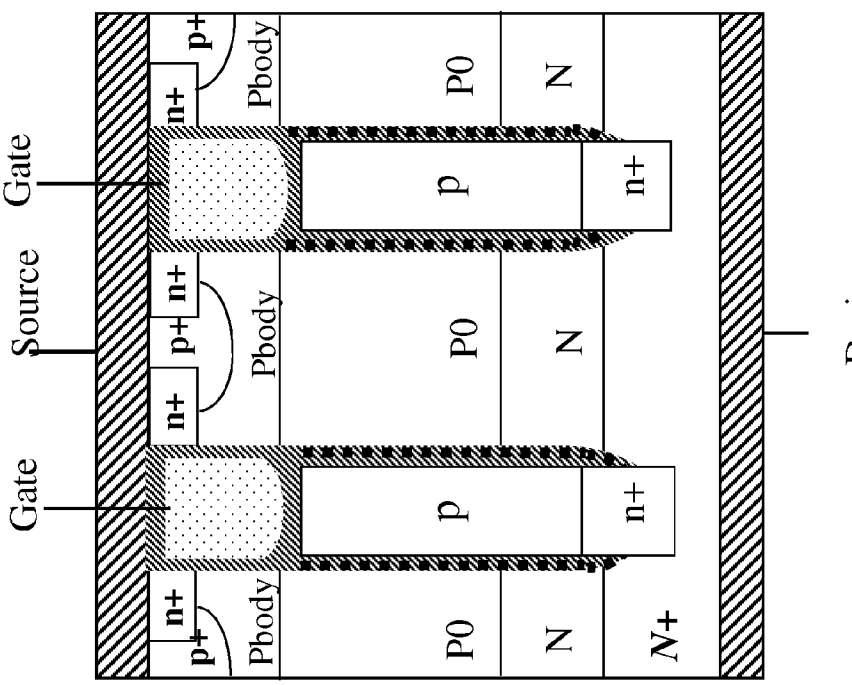
Figure 6(a): A trench MOS transistor similar to that shown in figure 4(a) but with a N-drift region provided on top of the N+ substrate.

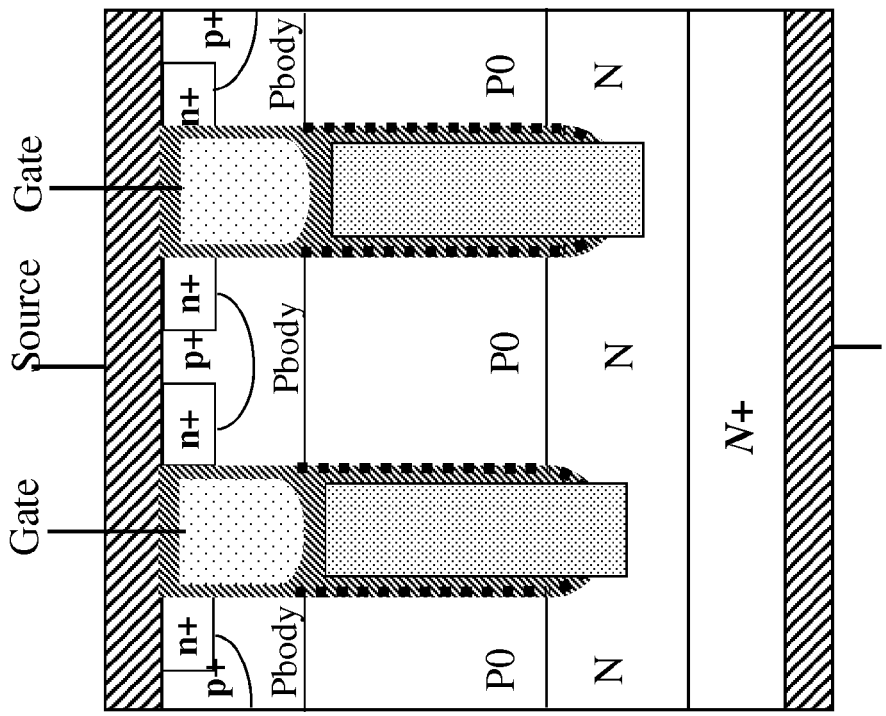
Figure 7(b) : A trench MOS transistor similar to that shown in Figure 6(b) but with trench depth extending only to the N-drift region.
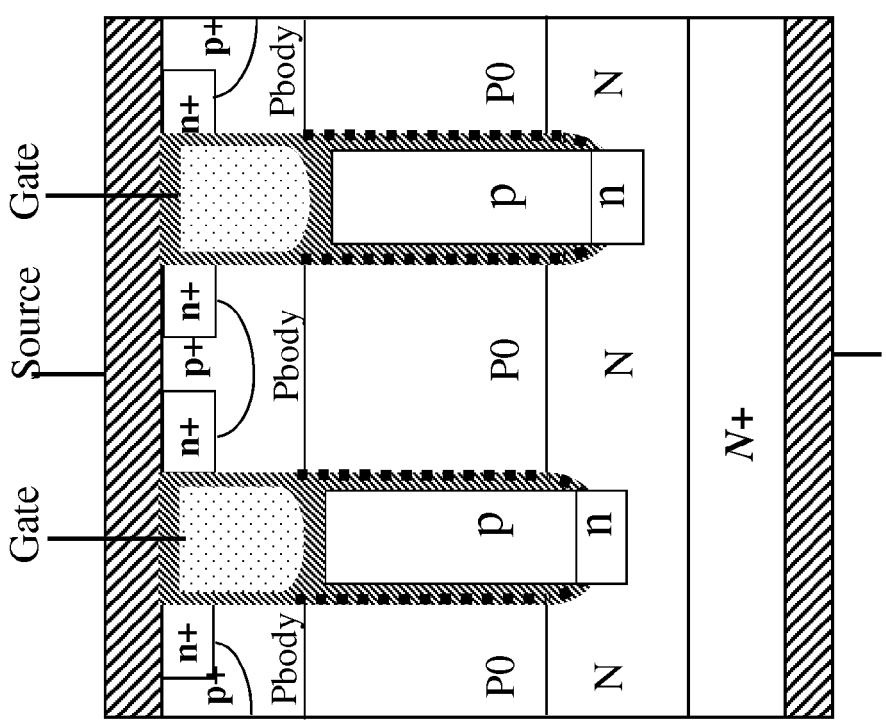
Figure 7(a) : A trench MOS transistor similar to that shown in Figure 6(a) but with trench depth extending only to the N-drift region.

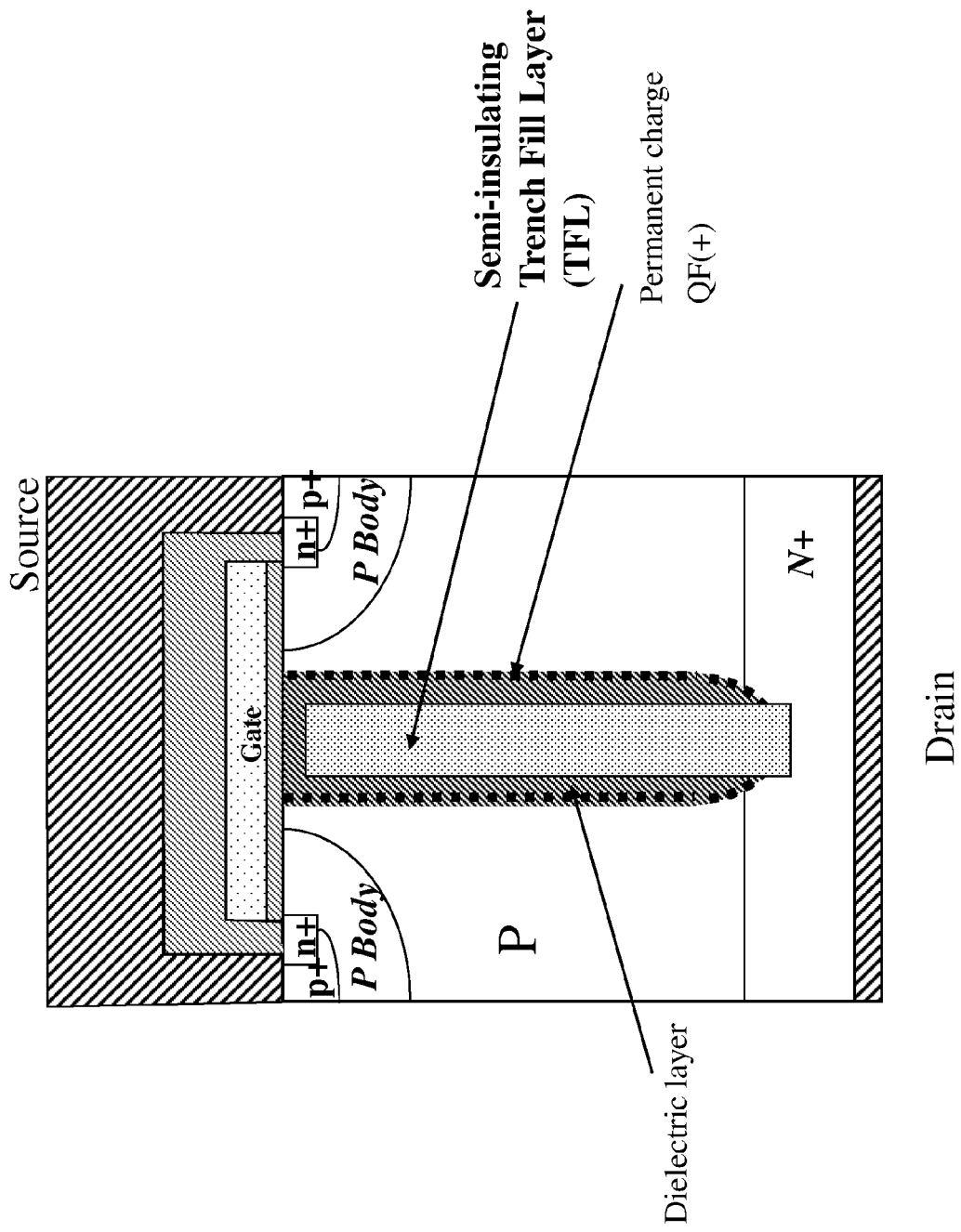
Figure 8(a) A planar MOS transistor having trench filled with semi-insulating layer and dielectric material containing permanent charge

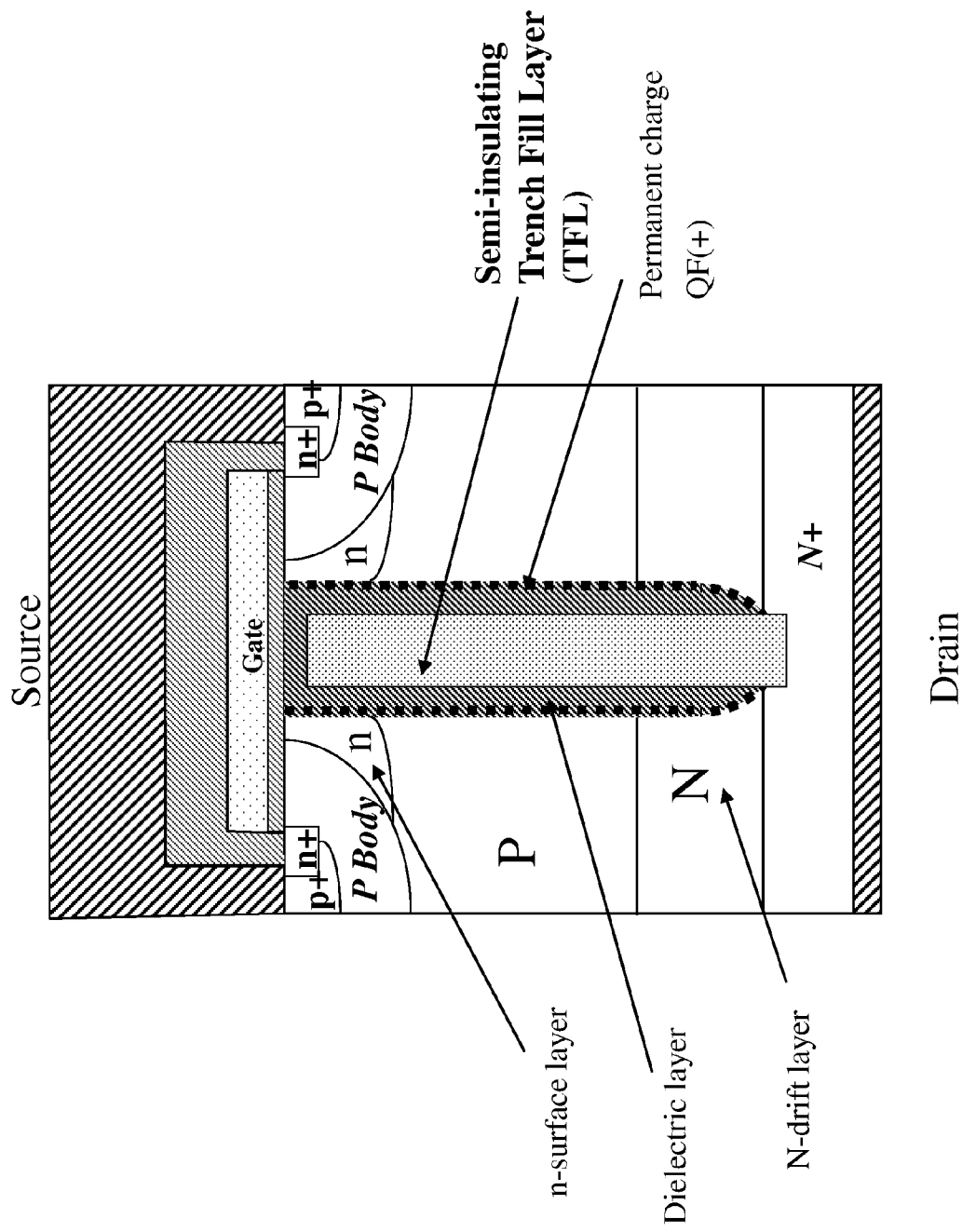
Figure 8(b): A planar MOS transistor similar to that shown in Figure 8(a) but with an additional surface n-layer and N-drift layer.

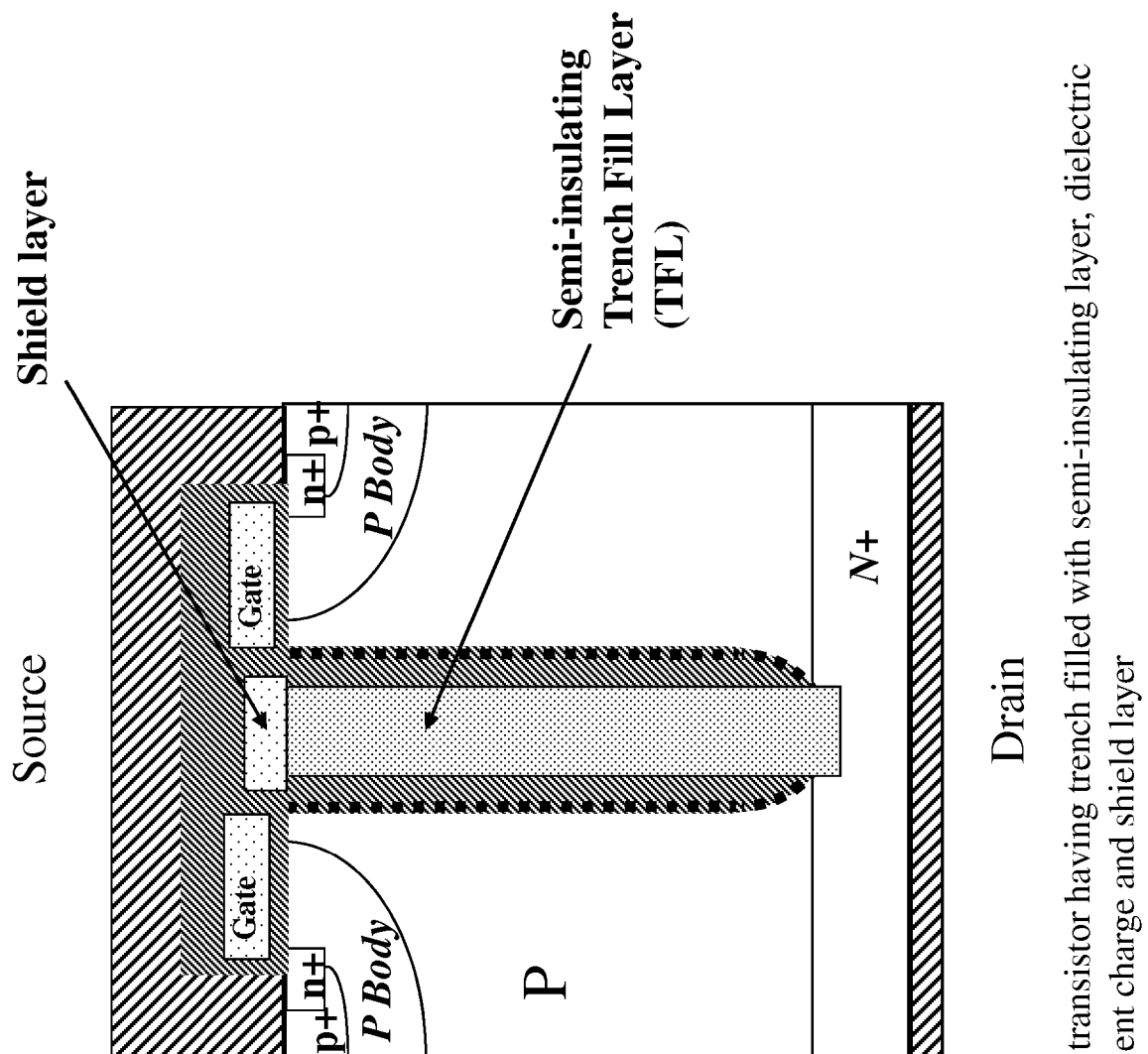
Figure 9(a): A planar MOS transistor having trench filled with semi-insulating material containing permanent charge and shield layer

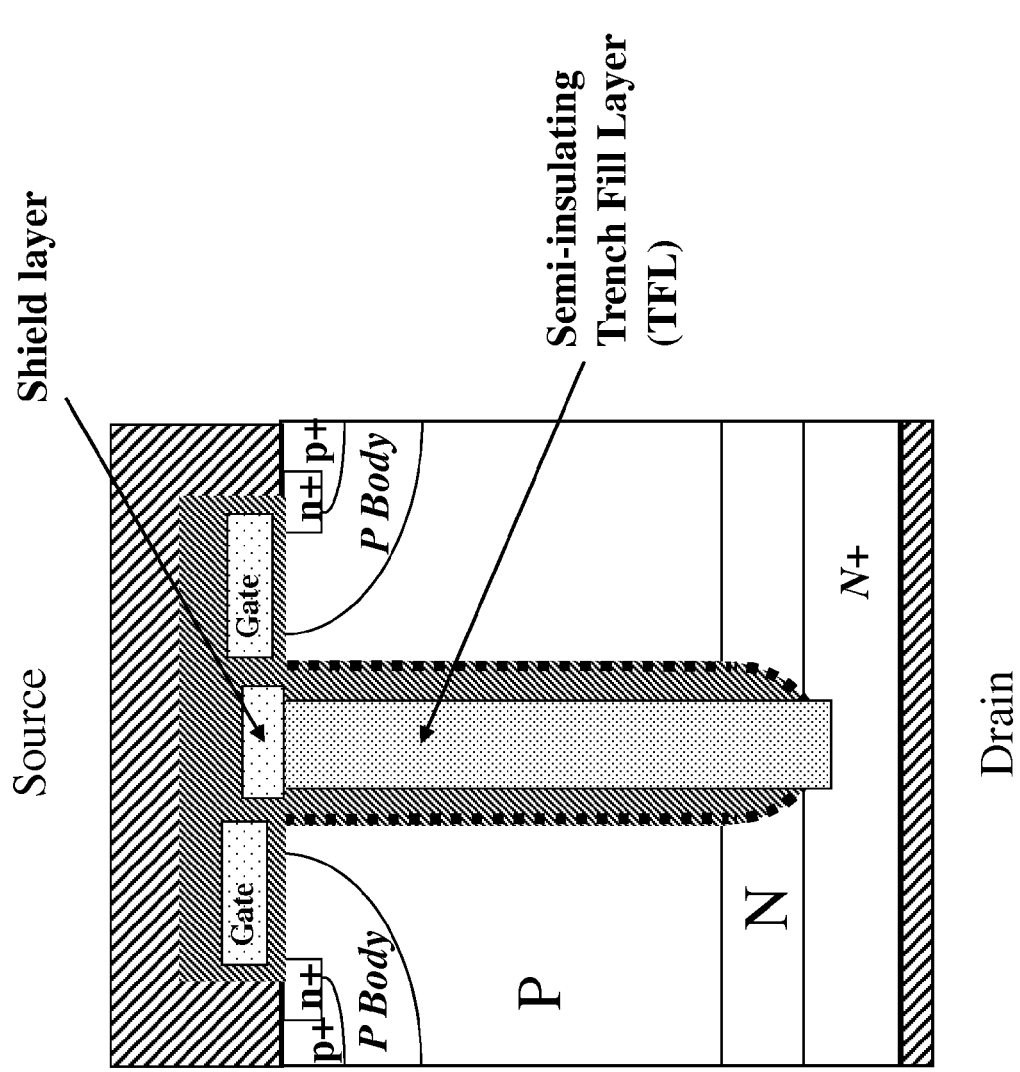
Figure 9(b): A planar MOS transistor similar to that of Figure 9(a) but with an additional N-layer drift on top of the N+ substrate.

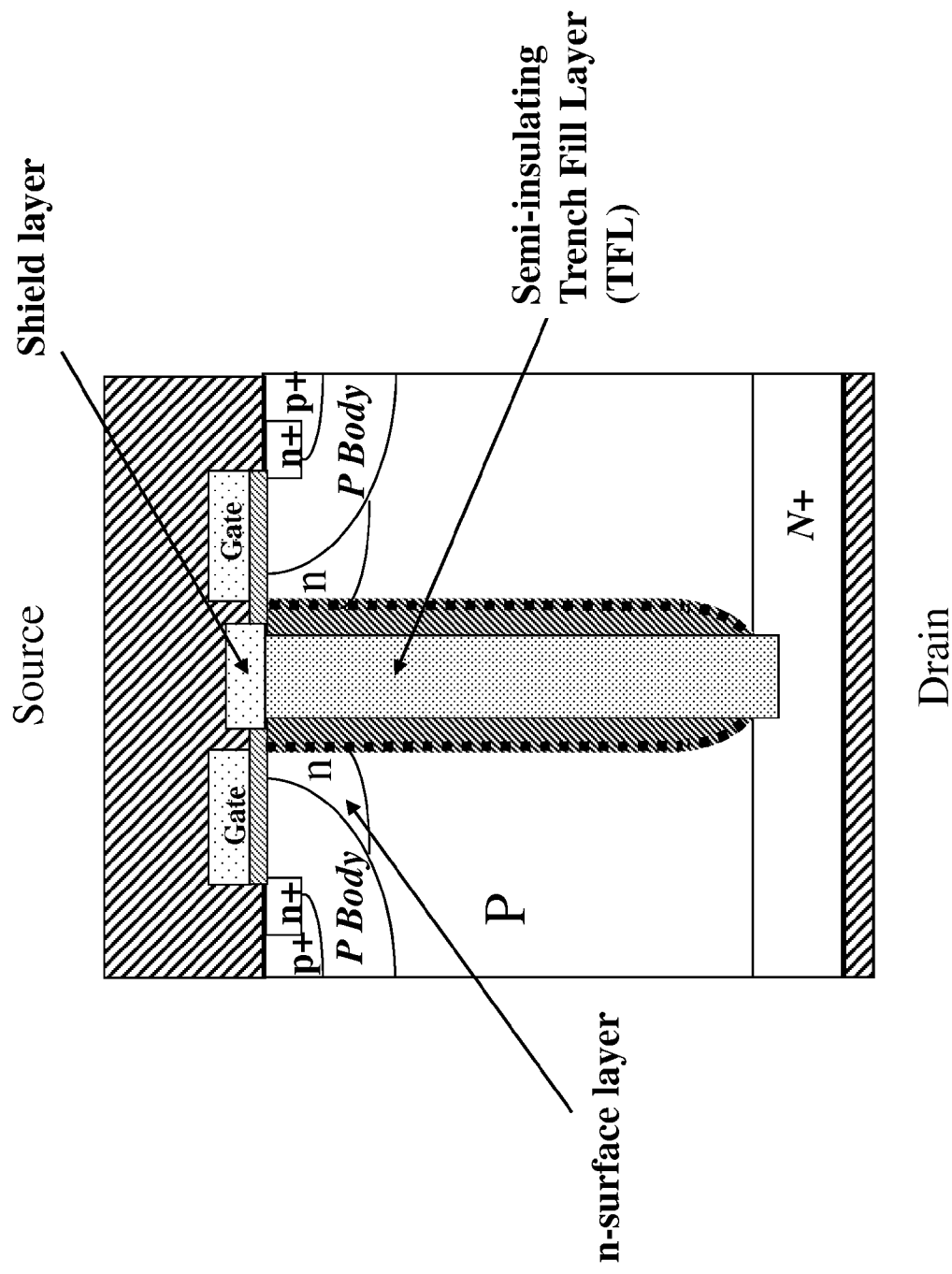
Figure 9(c): A planar MOS transistor similar to that of Figure 9(a) but with an additional n-layer at the surface.

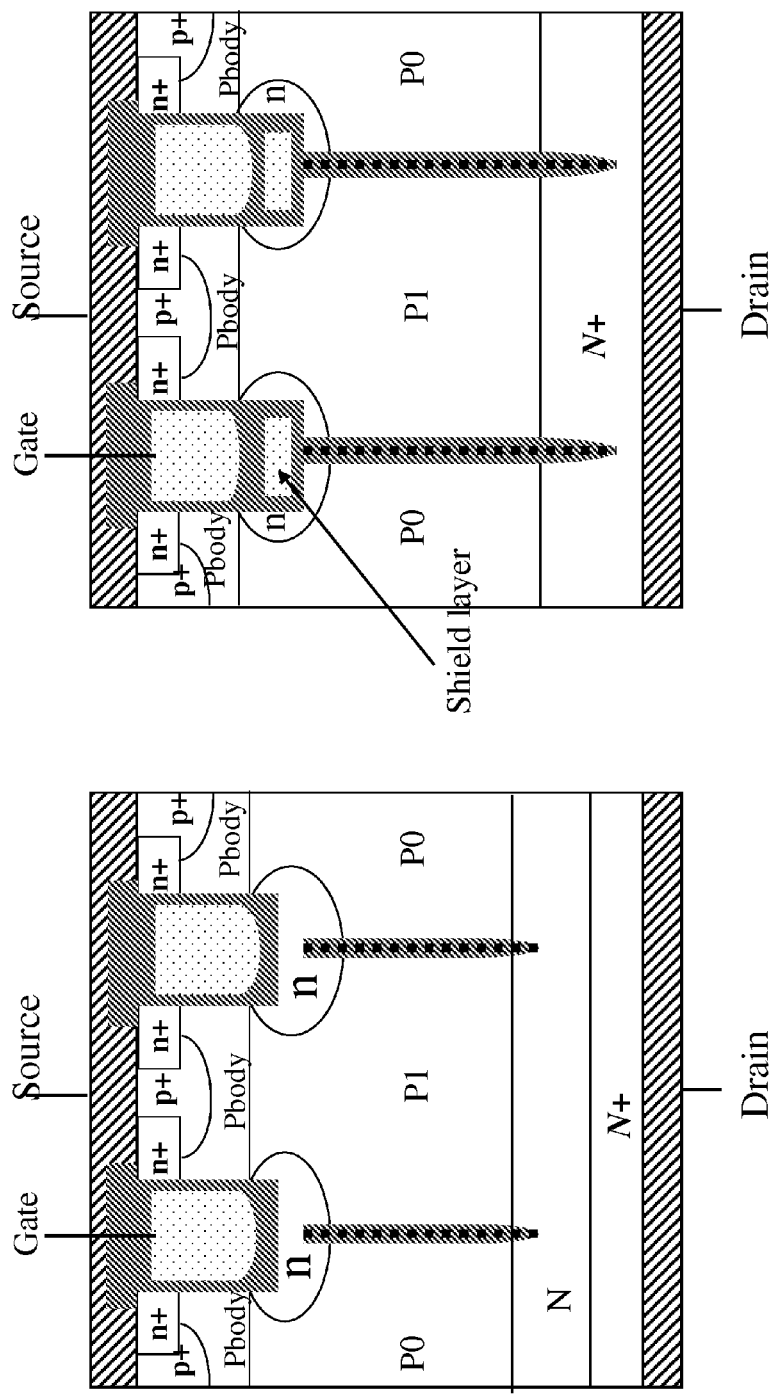
Figure 10(c): A trench DMOS transistor similar to that shown in figure 10(b) but with conducting shield layer
Figure 10(b): A trench MOS transistor similar to that shown in figure 10(a) but with N-drift region provided between the P region and the N+ substrate.

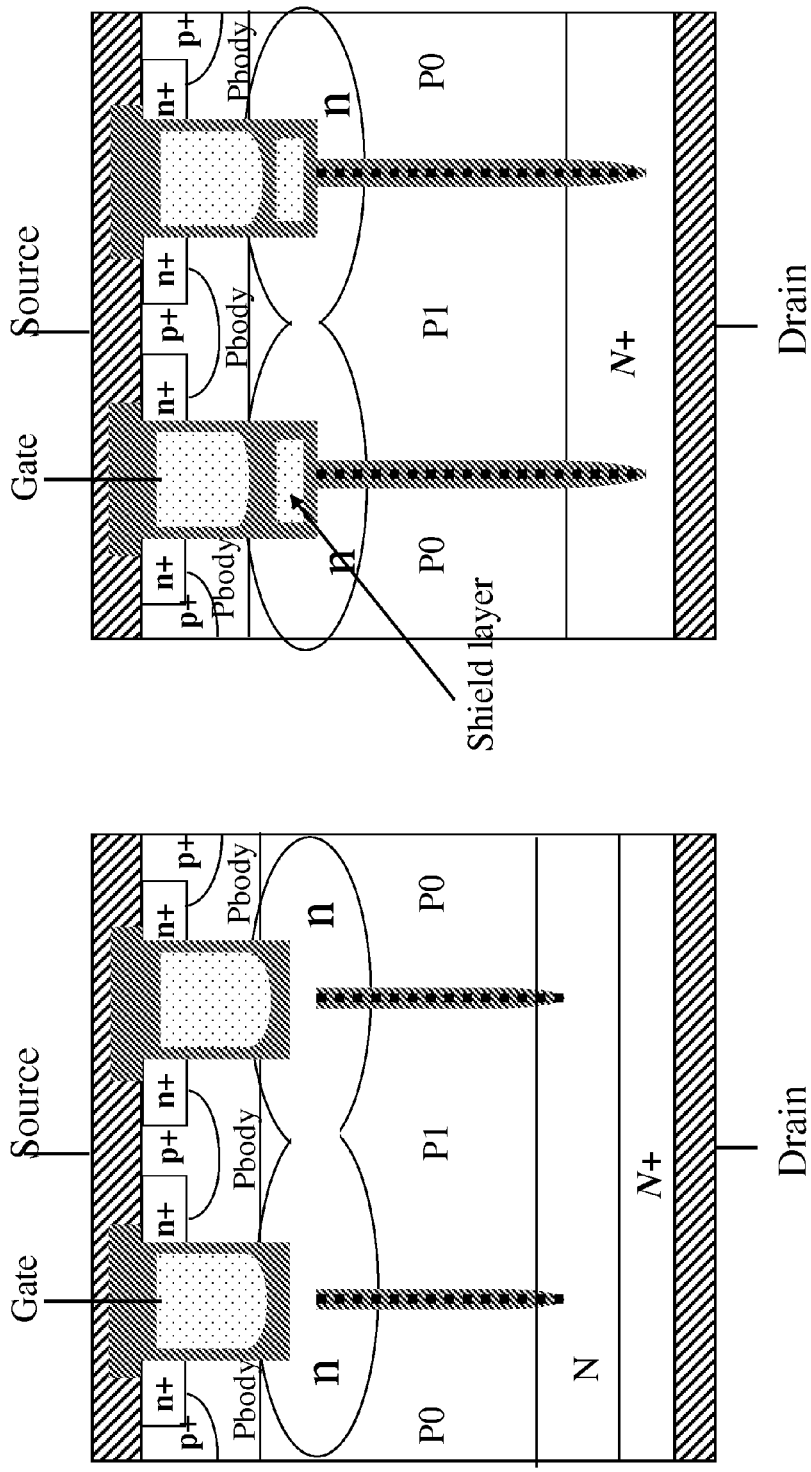
Figure 10(d): A trench MOS transistor similar to that shown in figure 10(b) but with the n-regions below the trench gated overlap.
Figure 10(e): A trench MOS transistor similar to that shown in figure 10(c) but with the n-regions below the trench gated overlap.

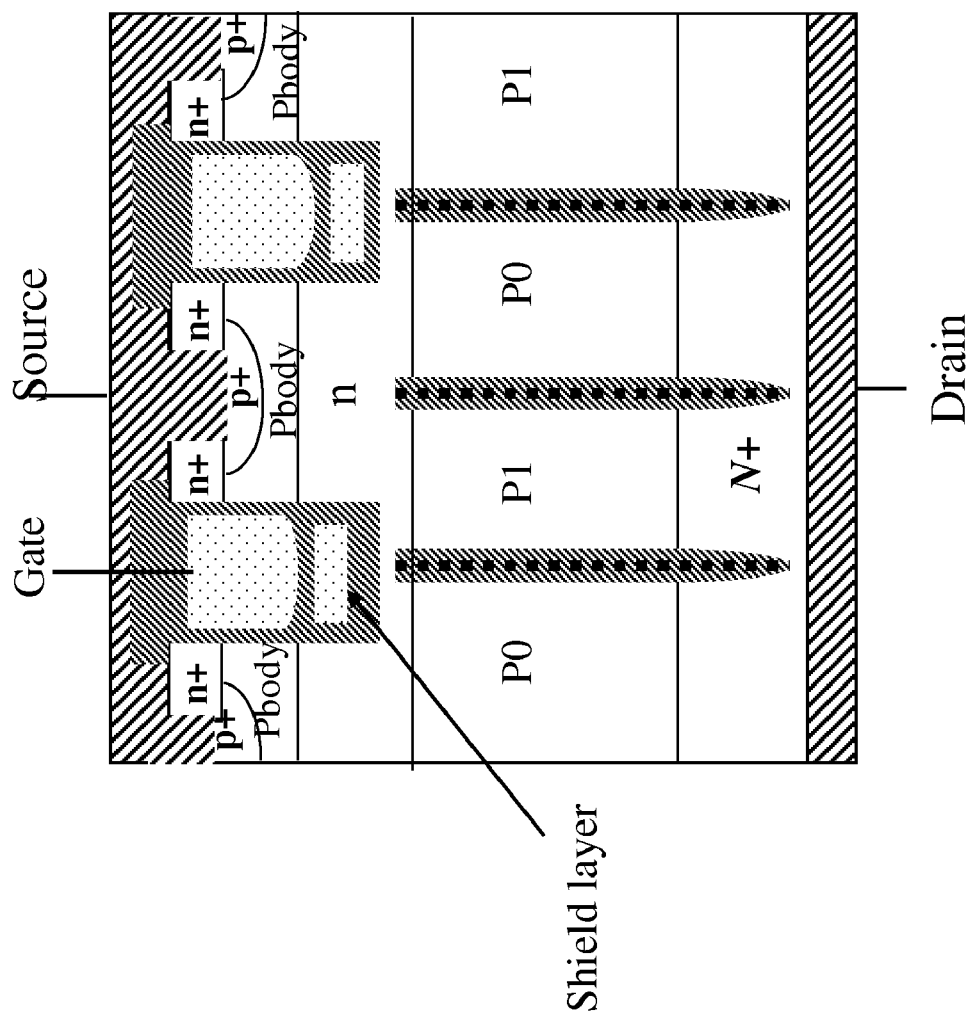
Figure 11(b): A trench MOS transistor similar to that shown in figure 11(a) but with shield layer under gate electrode.

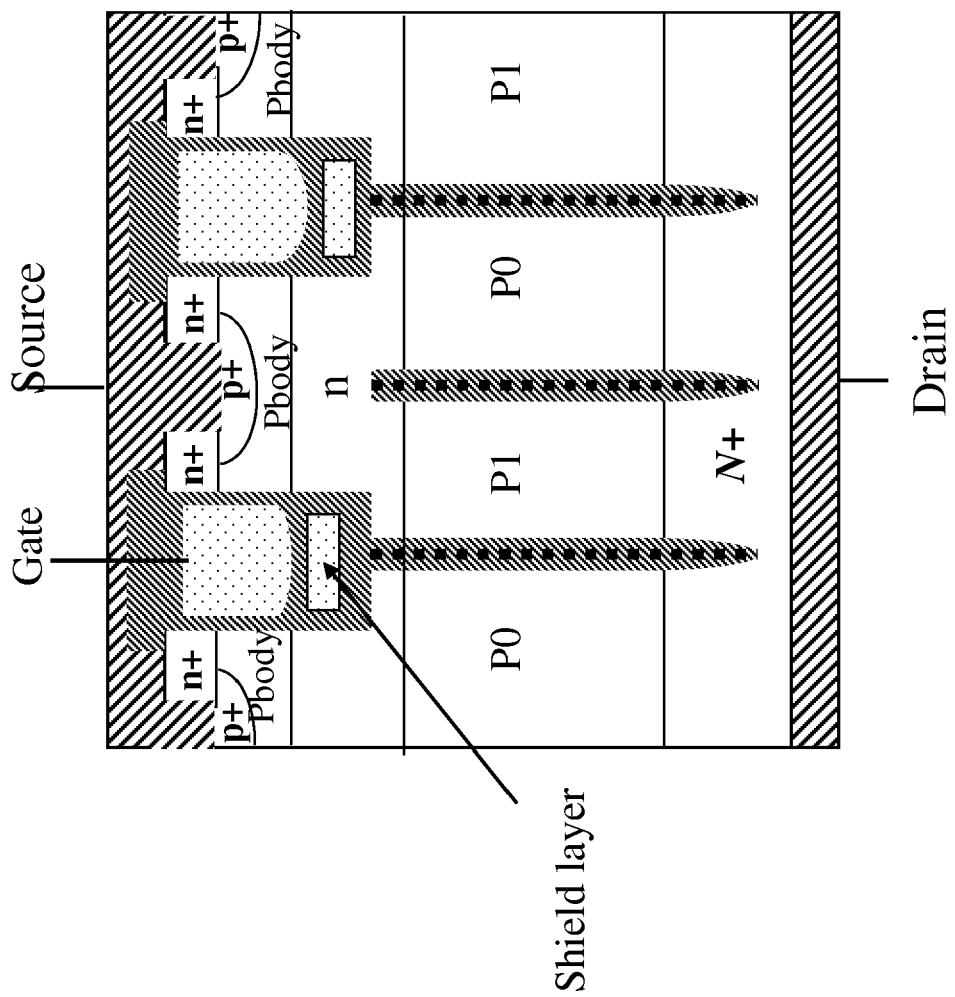
Figure 11(c): A trench MOS transistor similar to that shown in figure 11(b) but with the trench gate dielectric overlaps buried dielectric layers.

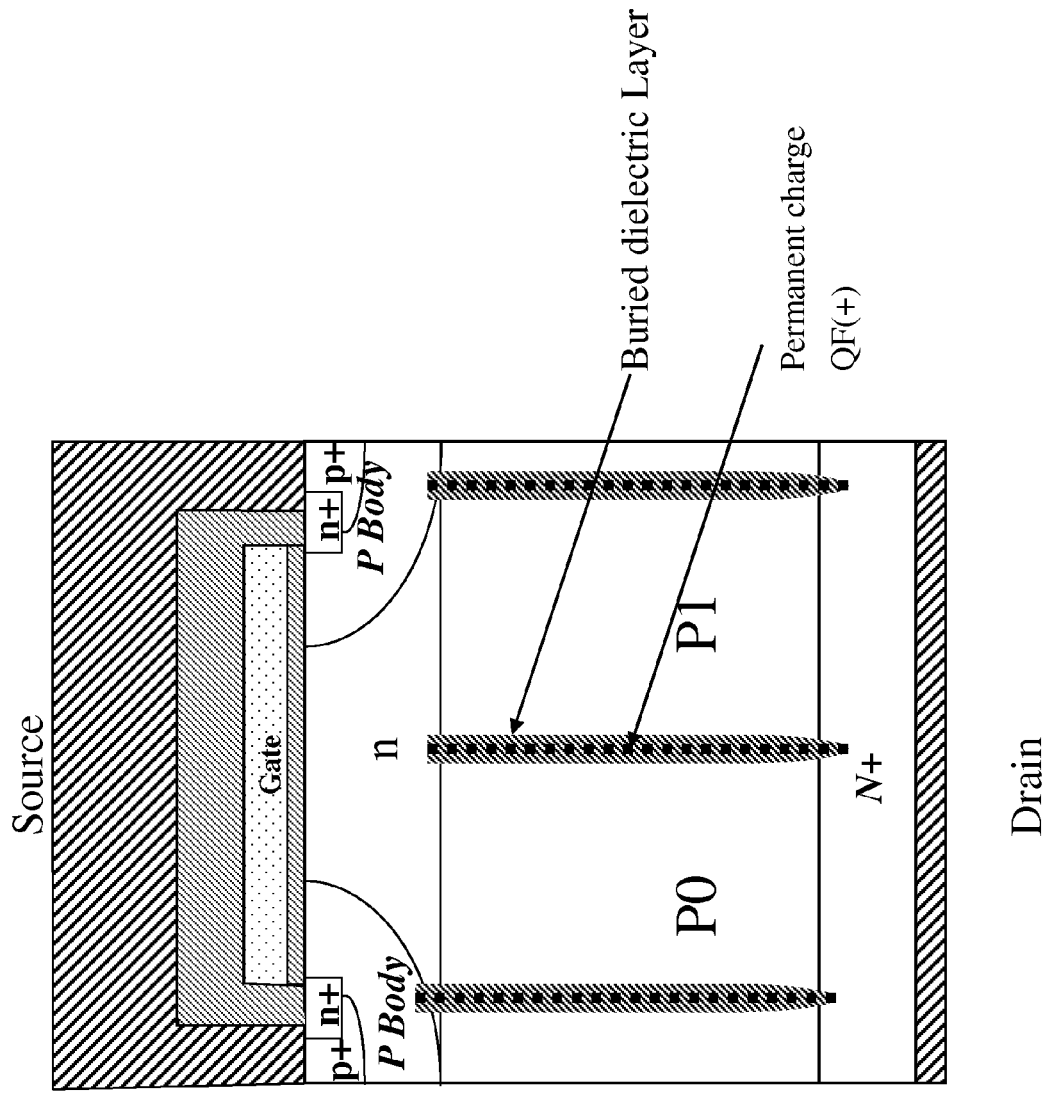
Figure 12(a): A planar MOS transistor with buried dielectric layers that include permanent charge.

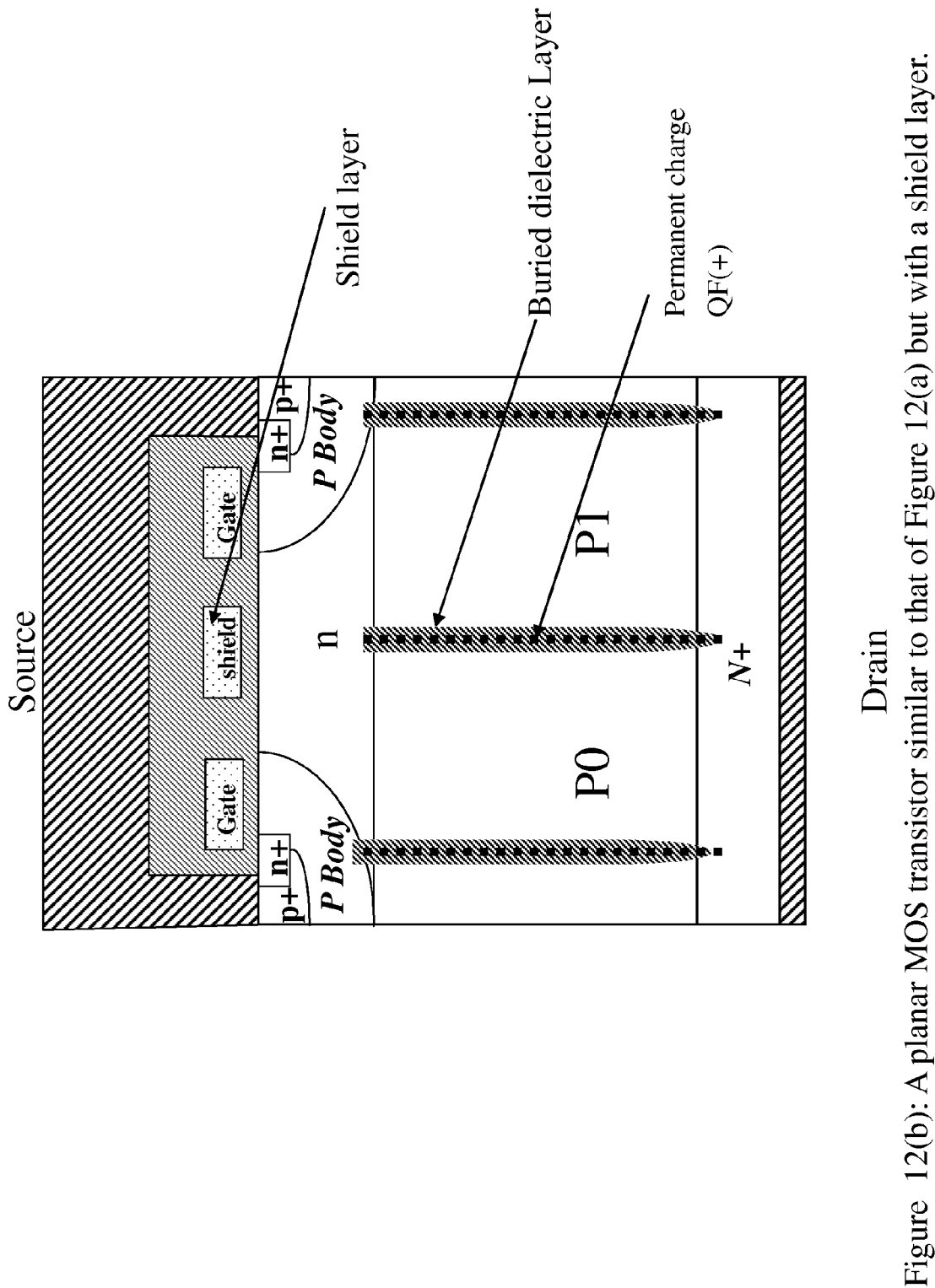
Figure 12(b): A planar MOS transistor similar to that of Figure 12(a) but with a shield layer.

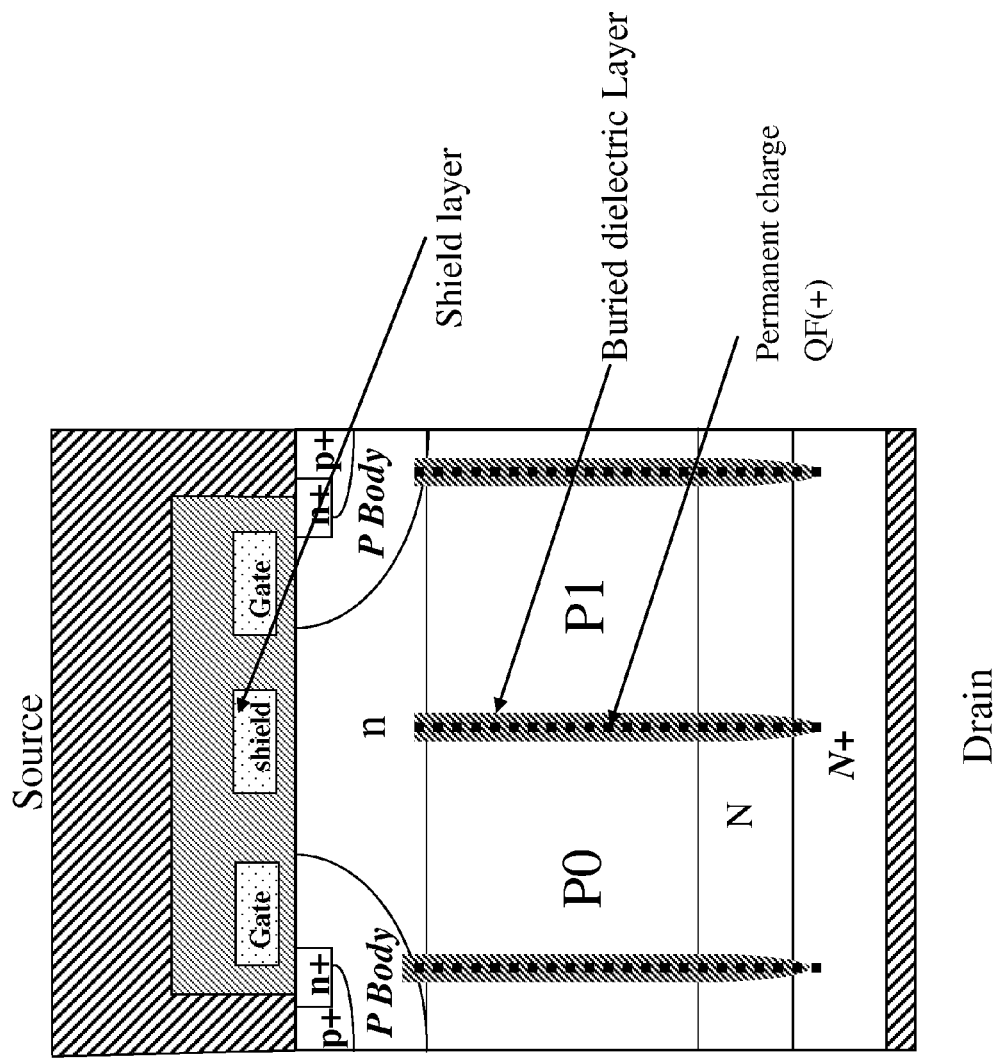
Figure 12(c): A planar MOS transistor similar to that of Figure 12(b) but with an additional N layer on top of the N+ substrate..

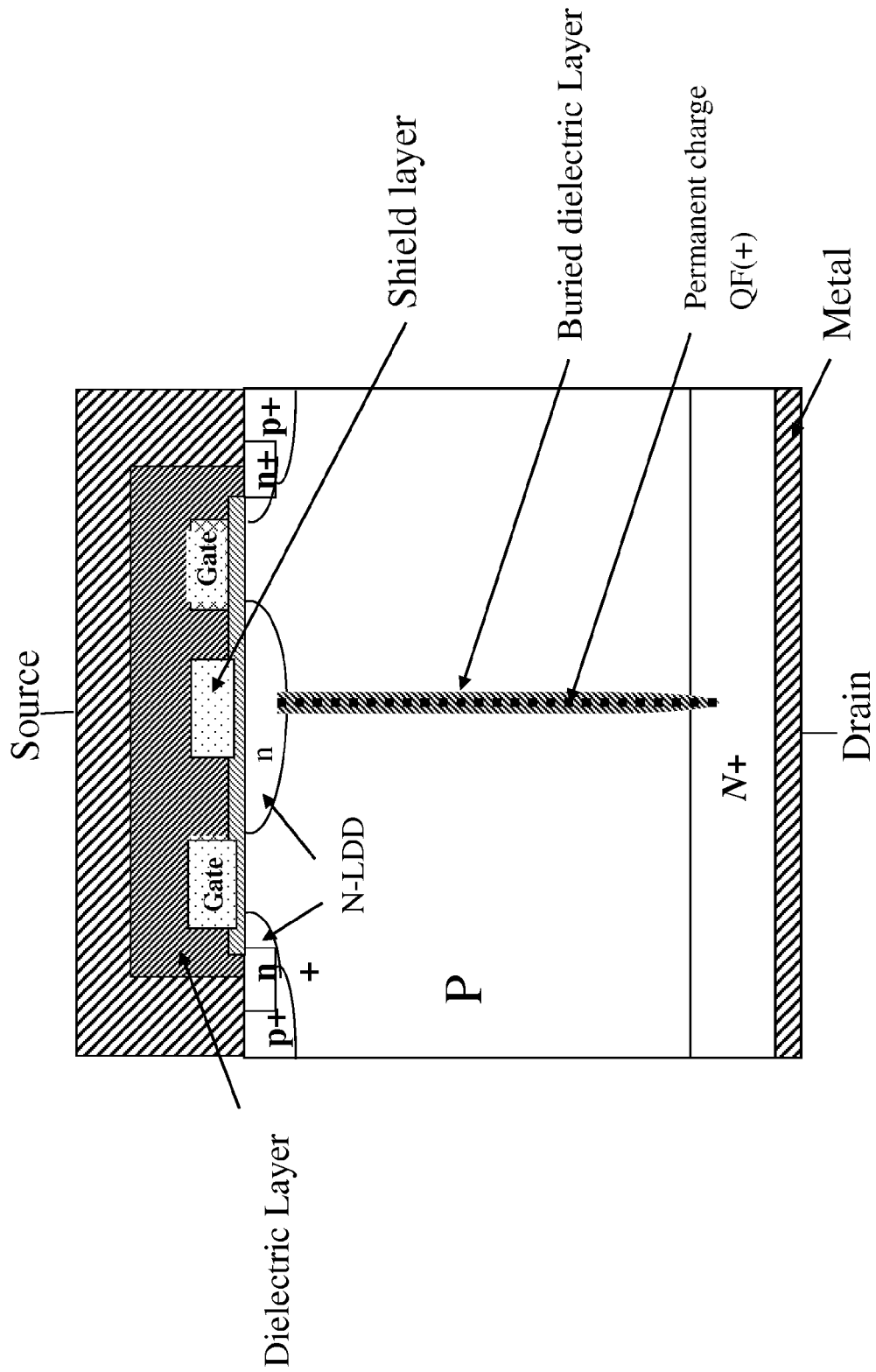
Figure 13(a): A planar MOS transistor with buried dielectric layers that include permanent charge.

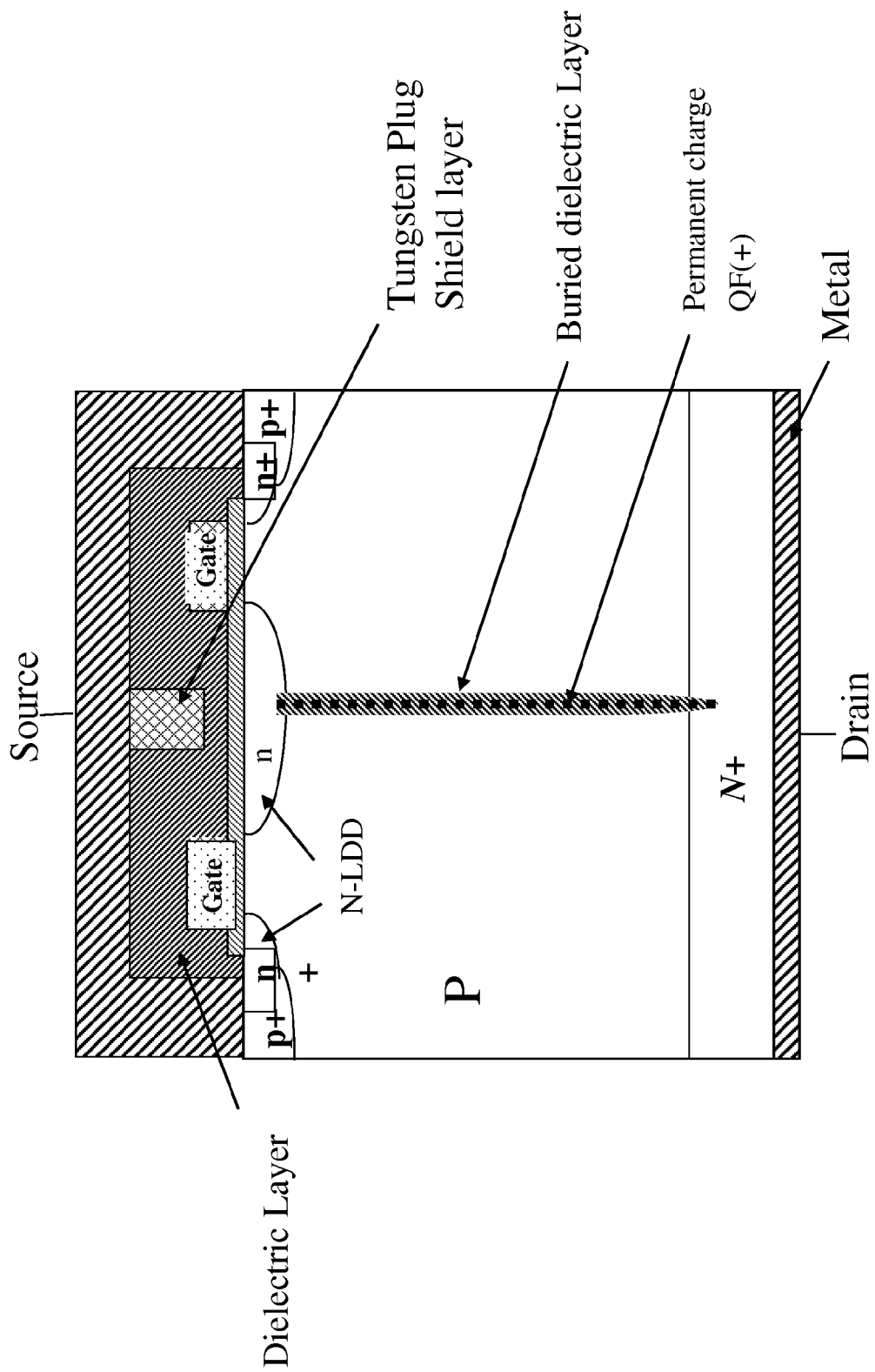
Figure 13(b): A planar MOS transistor similar to that of Figure 13(a) but with tungsten plug shield layer.

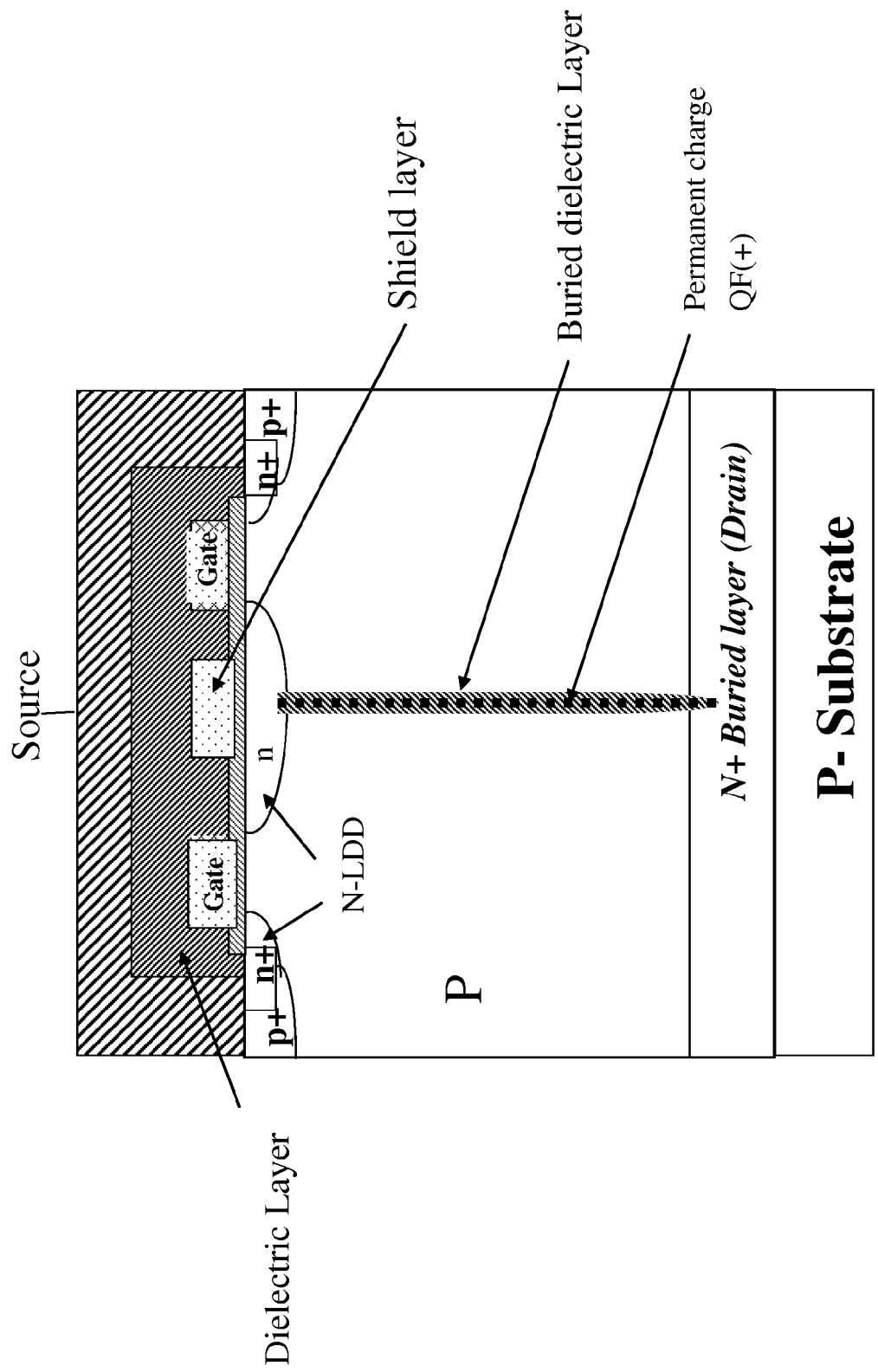
Figure 14: A quasi-vertical planar MOS transistor with buried dielectric layers that include permanent charge.

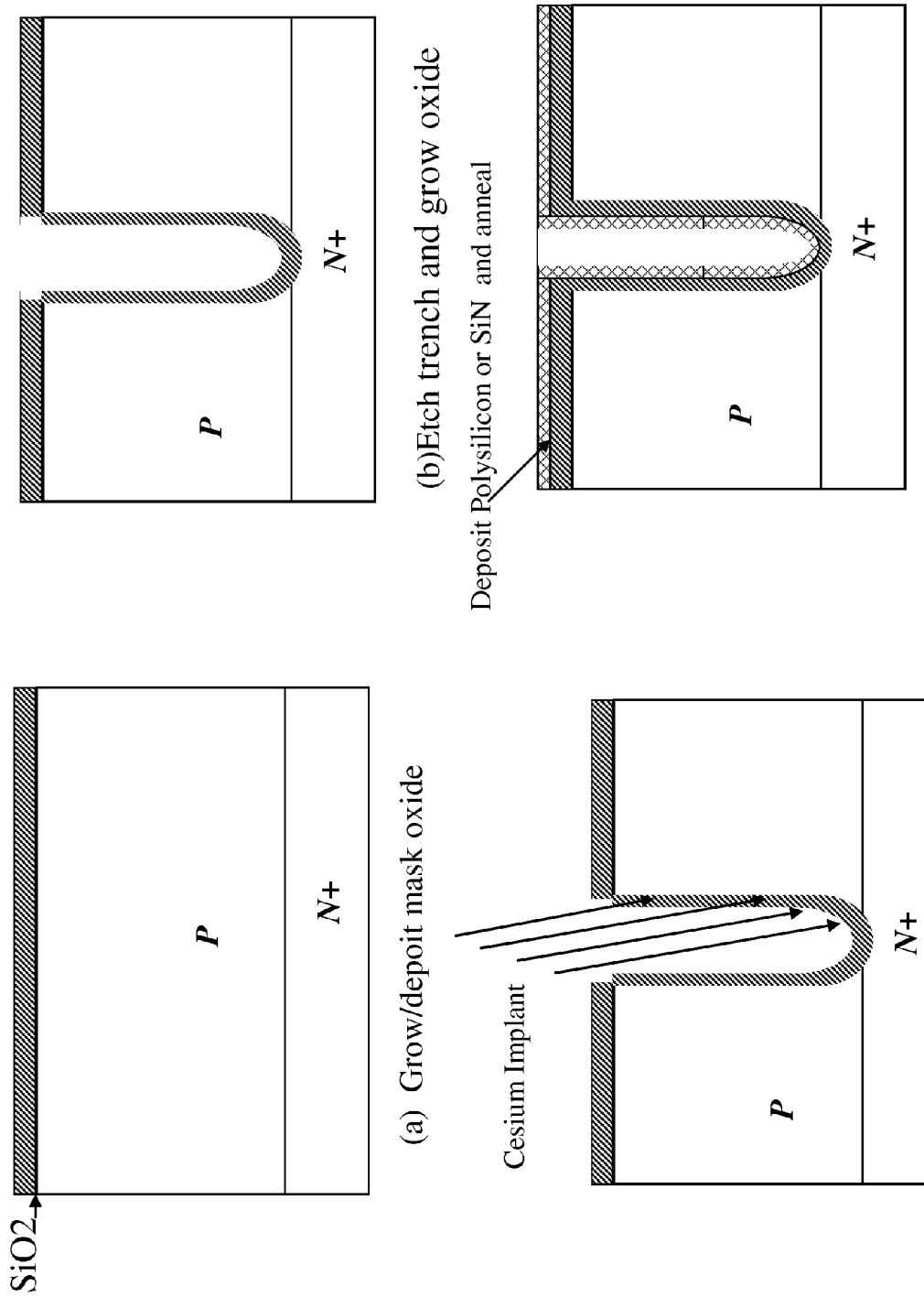
Figure 15 (a)-(d)

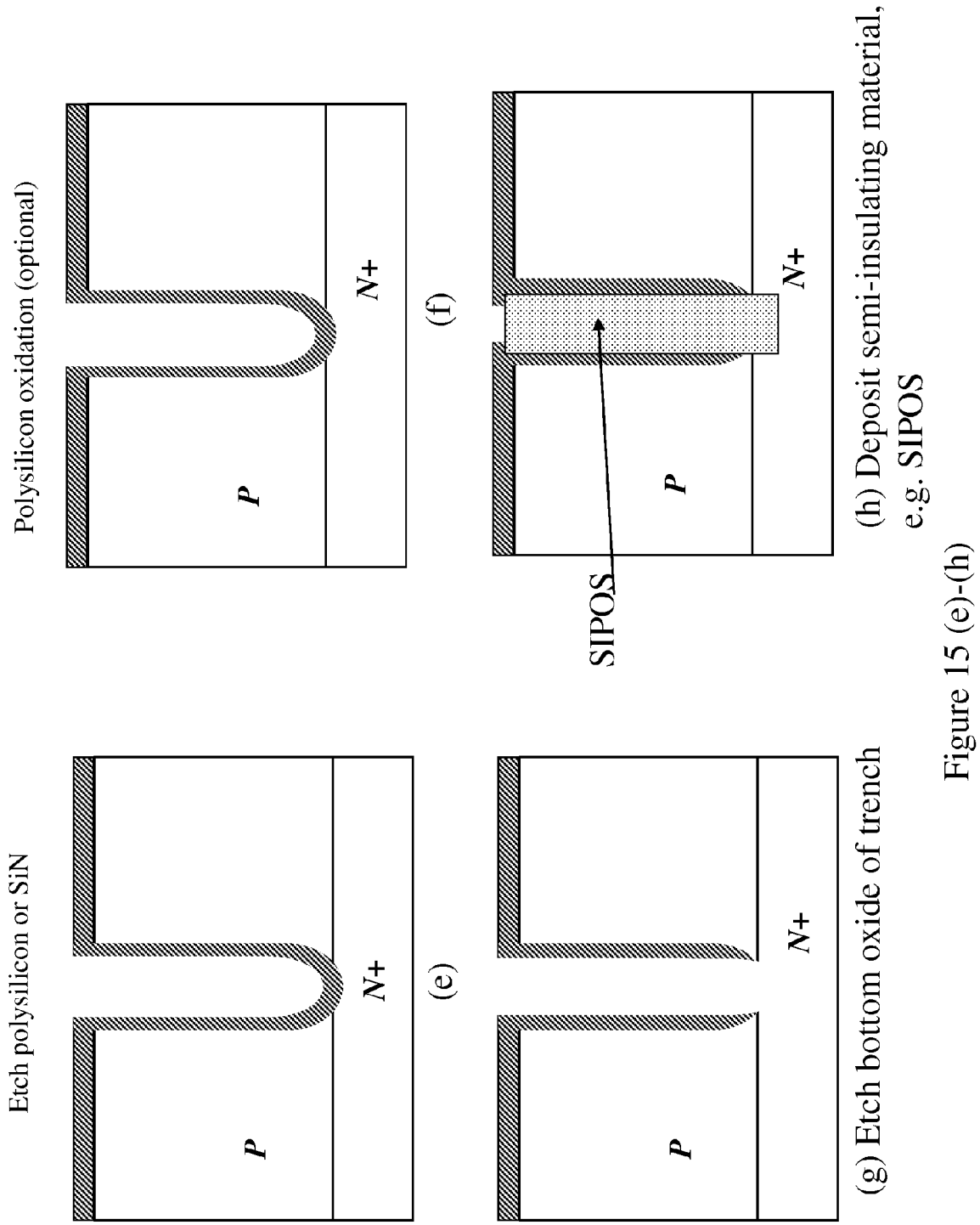
Figure 15 (e)-(h)

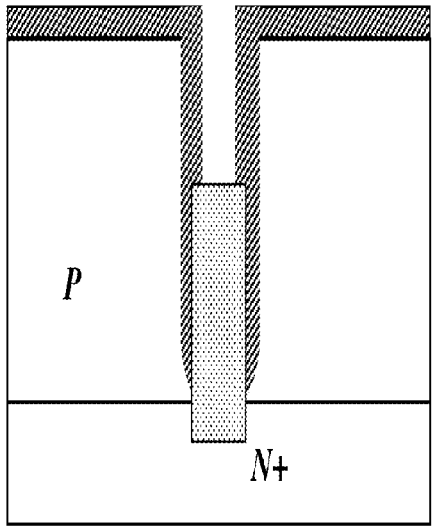
(i) Etch back SIPOS
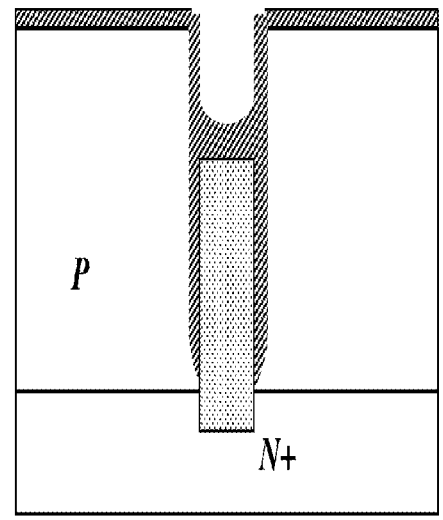
(j) Form gate oxide
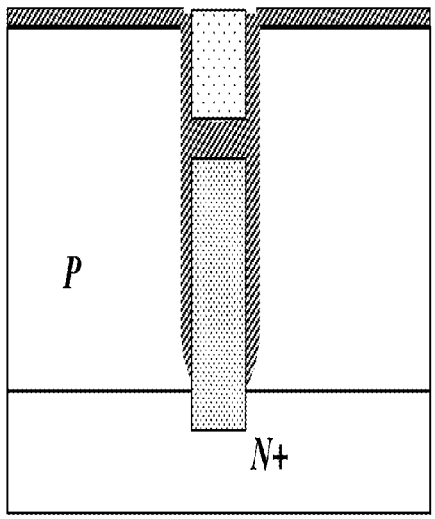
(k) Form gate electrode
Figure 15 (i)-(k)

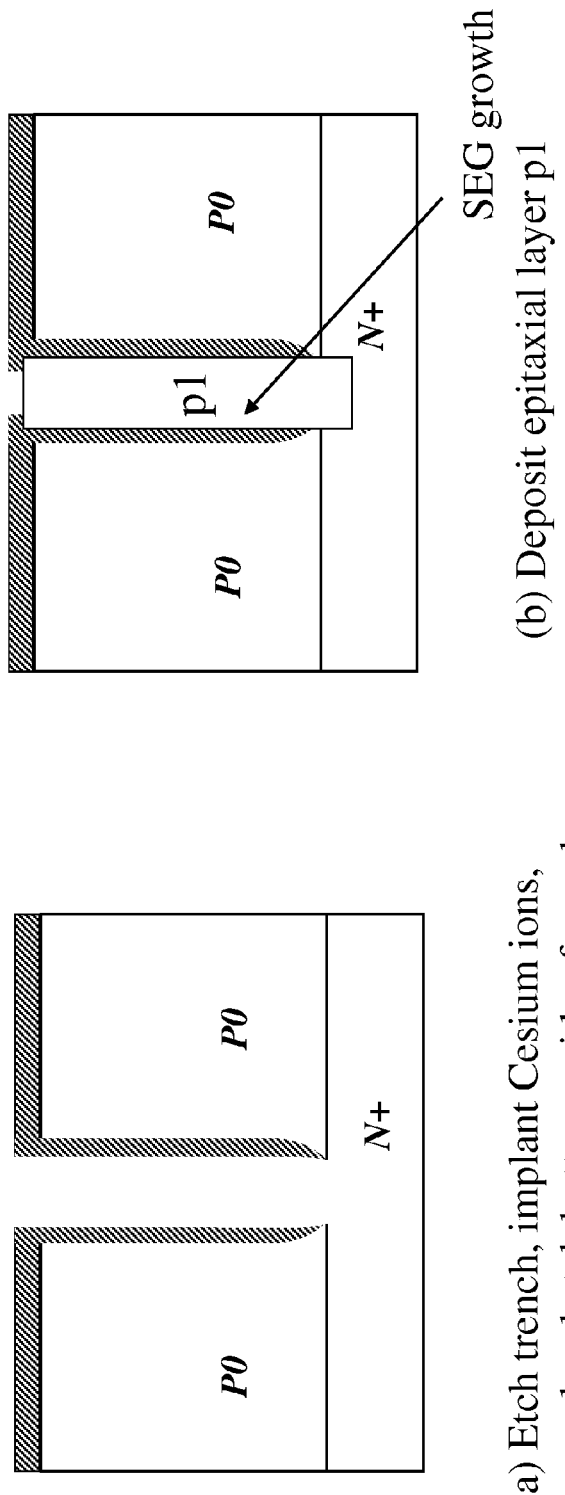
Figure 16 (a)-(b)

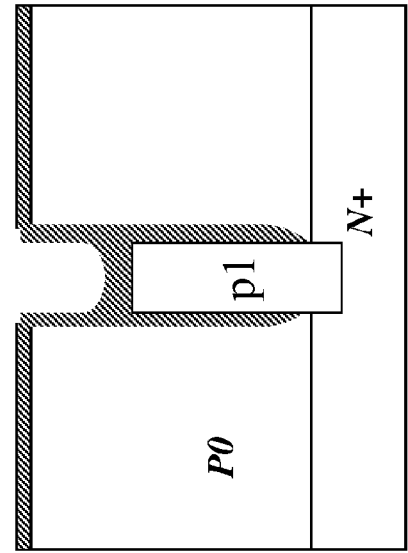
(d) Form gate oxide
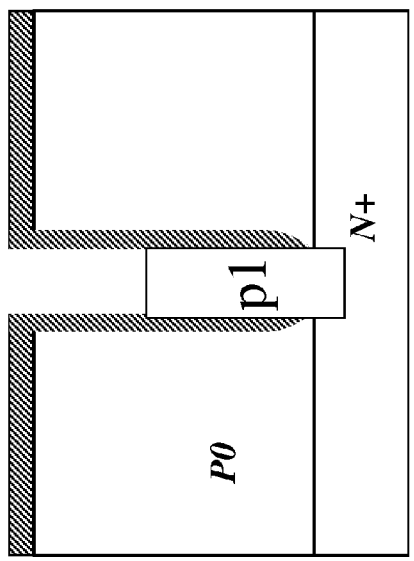
(c) Etch back epi layer p1
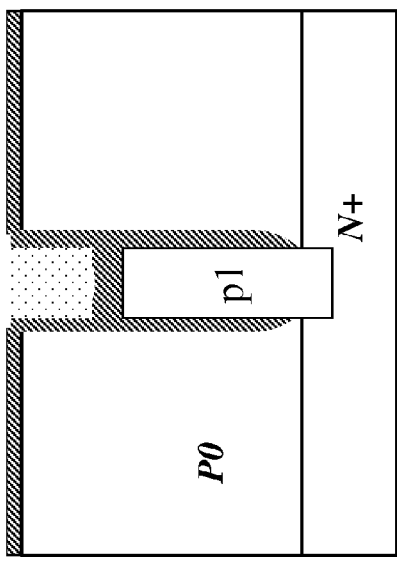
(e) Form gate electrode
Figure 16 (c)-(e)

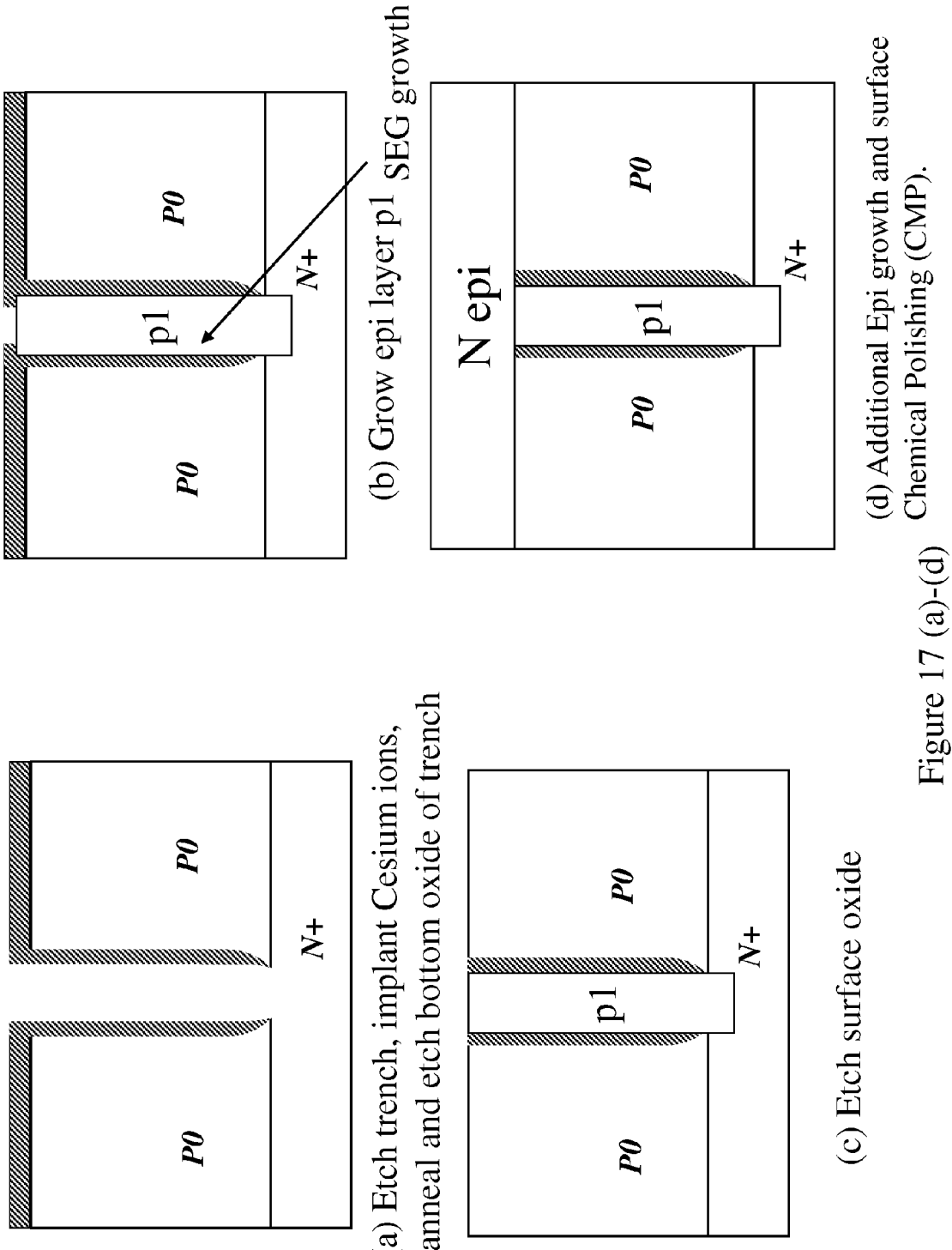
Figure 17 (a)-(d)

Trenches having different widths result in charge being introduced to different depths

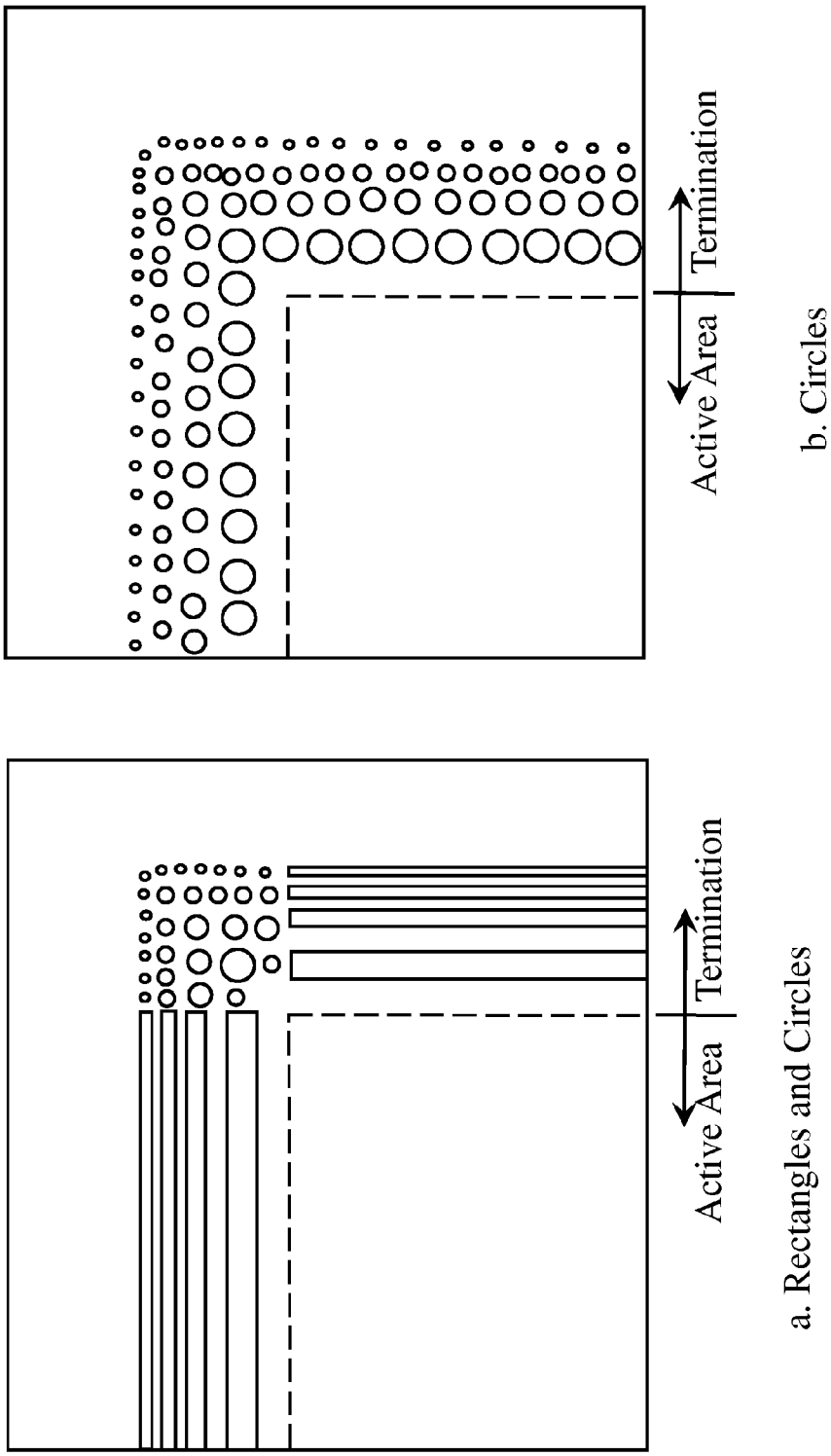
Figure 21 Examples of layouts that could be used for edge terminations
a. Rectangles and Circles
b. Circles

POWER SEMICONDUCTOR DEVICES, METHODS, AND STRUCTURES WITH EMBEDDED DIELECTRIC LAYERS CONTAINING PERMANENT CHARGES

CROSS-REFERENCE

Priority is claimed from U.S. application 61/168,794 filed 13 Apr. 2009, which is hereby incorporated by reference.

BACKGROUND

The present application relates to power devices, and more particularly to power devices with vertical or lateral current flow through a drift region.

Note that the points discussed below may reflect the hindsight gained from the disclosed inventions, and are not necessarily admitted to be prior art.

High voltage devices such as Diodes, JFETs, IGBTs and MOSFETs are widely used as switching devices in many electronic applications. In order to minimize the conduction power loss in power MOSFETs, it is desirable to have a low specific on-resistance ($R_{SP}$ or $R^*A$), which is the product of the on-resistance of the MOSFET multiplied by the active die area. In general, the on-resistance of a power MOSFET is dominated by the channel and drift region resistances. In recent years, the so-called superjunction structure has been developed to reduce the drift region resistance. A superjunction device is constructed by paralleling highly doped alternating p-type and n-type layers or pillars. For a given breakdown voltage, the doping concentration of the n-type pillars (the n-type drift region), can be significantly higher than that of a conventional drift region, provided that the total charge of the n-type pillar is balanced with the charge in the p-type pillar. In order to fully realize the benefit of the superjunction technology, it is desirable to pack many pillars in a given area to achieve a lower $R_{SP}$. However, the minimum widths of the n-type and p-type pillars which can be reached in device manufacturing, set a limit on the minimum cell pitch as well as on scaling of the device.

Recently, some of the present inventors have addressed this issue by incorporating permanent positive charge ($Q_F$) in trenches filled with dielectric material such as silicon oxide. FIGS. 1 and 2 generally illustrate these concepts, and more detail can be found in published US Applications 20080191307, 20080164516, and 20080164518, all of which are hereby incorporated by reference.

FIG. 1 shows an example of a diode structure, in which frontside metallization 103 and backside metallization 102 provide low-resistance connections for cathode and anode, respectively. The semiconductor mass, in this example, is silicon, and has a p-type epitaxial layer 112 over an n+ substrate 110. A P+ doped region 114 provides good ohmic contact to the frontside metallization 103. Trenches 120 are filled (in this example) with a dielectric material 122, typically silicon dioxide. Permanent charge 124 is present near the sidewalls of the trenches 120. For example, such charge can be introduced by angle-implanting cesium ions into a thin grown oxide on the sidewalls of the trenches 120 before they are filled.

FIG. 2 shows one example of a trench transistor as described in the published applications referenced above. Here insulated gate electrodes 230 are present in the upper parts of trenches 120, and the semiconductor structure near the front surface includes a p-type body region 240 which is contacted by a p+ body contact diffusion 242, as well as an n+ source region 244. Positive permanent charge 124 is present near the trench sidewalls, and provides improved charge balancing when the epitaxial layer 112 is depleted under reverse bias.

The permanent charge also forms an induced drift region by forming an inversion layer along the interface between the oxide and the P-type layer. Using this new concept, the scaling limitation due to inter-diffusion of p-type pillar and n-type pillar can be eliminated. Consequently, a small cell pitch and high packing density of pillars (and of channel area) can be realized, to thereby reduce the device total on resistance and $R_{SP}$.

As the trench depth increases and cell pitch reduces, the trench depth to width aspect ratio increases. High aspect ratio trenches are more difficult to fill with dielectric material, and manufacturing the device becomes a problem. Furthermore, as the cell pitch is reduced and the cell density increases, the associated intrinsic capacitances of the device also increase undesirably. These include the gate-to-source and gate-to-drain capacitances Cgs and Cgd. The corresponding gate-source and gate-drain charges charge Qgs and Qgd also increase.

SUMMARY

The present application discloses a number of new approaches to overcoming the problems of prior art devices.

One class of new devices includes refilled trenches. In various embodiments the trench fill material can be epitaxially grown upward from the underlying semiconductor substrate, or can be a deposited semiconducting or semi-insulating material.

The present application also discloses a variety of new device structures, which generally, in various ways, include buried or embedded layers of dielectric material which contain permanent charges. Preferably these charges are positioned and oriented in proximity to carrier trajectories in the drift region.

The disclosed innovations, in various embodiments, provide one or more of at least the following advantages. However, not all of these advantages result from every one of the innovations disclosed, and this list of advantages does not limit the various claimed inventions.

Reduced specific on-resistance ($R_{SP}$);
Reduced heat dissipation;
Improved energy efficiency;
Reduced parasitic capacitances;
Improved switching efficiency;
Improved switching speed;
Reduced cost for given performance parameters.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 and FIG. 2 schematically show diode and MOSFET structures previously proposed by ones of the present inventors.

FIG. 3($a$) shows a diode trench structure, and FIG. 3($b$) shows another diode structure.

FIGS. 4($a$), 4($b$), 4($c$), 4($d$), 5($a$), 5($b$), 5($c$), 5($d$), 6($a$), 6($b$), 7($a$), and 7($b$) show many different trench transistor structures, according to various disclosed innovative embodiments.

FIGS. 8($a$), 8($b$), 9($a$), 9($b$), and 9($c$) show many different planar and quasi-vertical transistor structures.

FIGS. 10(a), 10(b), 10(c), 10(d), 10(e), 11(a), 11(b), and 11(c) show various examples of trench gate transistors, according to various different innovative embodiments, which include buried dielectric layers with permanent electrostatic charges.

FIGS. 12(a), 12(b), and 12(c) show various embodiments of planar DMOS transistors, according to various different innovative embodiments, which include buried dielectric layers with positive permanent electrostatic charges.

FIGS. 13(a) and 13(b) show various other embodiments of planar CMOS compatible transistors, according to various different innovative embodiments, which include buried dielectric layers with permanent electrostatic charges, and also include shield layers.

FIG. 14 shows an example embodiment of a quasi-vertical device, according to various different innovative embodiments, which include buried dielectric layers with positive permanent electrostatic charges.

FIGS. 15(a)-15(l) show one possible process flow to fabricate trench gate transistors that contain trenches with SIPOS TFL that contain permanent charge.

FIGS. 16(a)-16(e) show a different process flow, in which trenches are filled with an epitaxial silicon trench filling layer.

FIGS. 17(a)-17(d) show one possible flow of fabricating buried dielectric layers that contain permanent charges.

FIGS. 20 and 21 show various layouts for the edge of the array, using graduated trench diameters.

FIGS. 22(a), 22(b), and 22(c) are plan views which show various alternatives for the layout of the refilled trenches and of the device channels.

DETAILED DESCRIPTION OF SAMPLE EMBODIMENTS

Figures 10A, 22B:
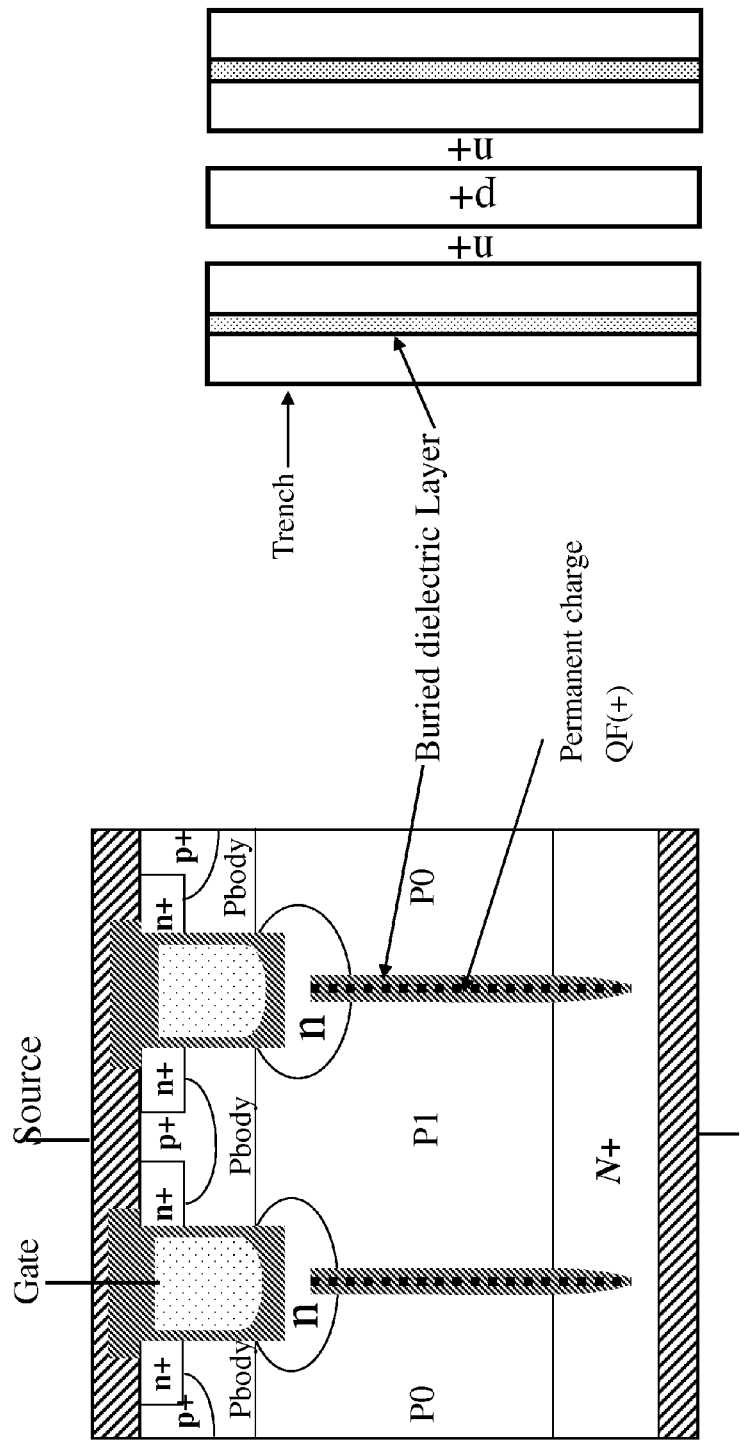
Figure 22C:
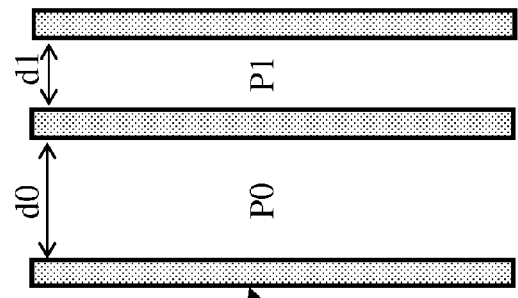

The numerous innovative teachings of the present application will be described with particular reference to presently preferred embodiments (by way of example, and not of limitation). The present application describes several inventions, and none of the statements below should be taken as limiting the claims generally.

The present application describes several new device and fabrication concepts, and many different ways to implement them. A number of these concepts and embodiments will be described in detail, but it must be remembered that the new concepts described here include some very broadly applicable points.

One class of embodiments describes devices which include trenches with walls covered by a dielectric material such as silicon dioxide that contains permanent charges and a Trench Fill Layer (TFL). A TFL is formed, for example, by using techniques such as Selective Epitaxial Growth (SEG). Alternatively, a TFL can be formed of a semi-insulating material such Semi-Insulating-Poly-Silicon (SIPOS), or of other process-compatible semiconducting or semi-insulating materials. Of course, the conduction properties of the trench fill layer will be affected by the choice of the TFL (and of its deposition conditions). Semiconductor material formed by Selective Epitaxial Growth will often have a higher level of crystal defects The disclosed device structures where the TFL is a silicon epitaxial layer (e.g. by using SEG) have the advantage that additional current paths are provided along the interfaces of the dielectric layers (containing permanent charge) and the epitaxial TFL layers. Therefore, current conduction occurs along all interfaces of a dielectric layer, rather than along one interface only (as in the case of a device using a dielectric or a semi-insulating material TFL). The additional current paths result in lower $R_{SP}$. Furthermore, the width of the dielectric layer (such as silicon dioxide) can be made very thin (in the order of 10 nm) and therefore results in a lower $R_{SP}$.

The present application discloses a number of new device structures, which generally, in various ways, include buried or embedded layers of dielectric material which contain permanent charges.

Buried dielectric layers formed for example by silicon dioxide can be completely surrounded by silicon material. In the on-state, inversion layers are formed along the dielectric layers edges due to the existence of permanent charges. These inversion layers provide current conduction paths and result in lower $R_{SP}$. Such structures can be fabricated for example using techniques such as Selective Epitaxial Growth (SEG) and permanent charges introduced using implanted Cesium ions.

FIG. 3(a) depicts a diode or voltage blocking trench structure built on p-type epitaxial layer (P0) formed on top of a N+ substrate 110. The trench walls are covered by dielectric material such as silicon dioxide that contain permanent positive charge. The trenches in FIG. 3(a) are filled with a silicon Trench Fill Layer (TFL). The TFL can be formed for example by Selective Epitaxial Growth (SEG). As shown in FIG. 3(a) the TFL has three different doped regions. At the bottom there is n+ region connected to the N+ substrate, in the middle a p-type region and on the top a p+ region. The TFL layer preferably completely fills the trench. The doping in the middle p region of the silicon TFL can be the same or different from starting material P0 epitaxial layer. The doping of TFL middle p-region is adjusted such that the diode structure can block a high voltage at reverse bias.

FIG. 3(b) depicts a diode or voltage blocking structure that is similar to that of FIG. 3(a) except that the TFL layer is formed by a high resitivity material such as polysilicon or semi-insulating material such as Semi-Insulating-Poly-Silicon (SIPOS). The high resistivity polysilicon can for example be formed of p-n neutralized polysilicon to reduce the temperature dependence of material characteristics.

FIG. 4(a) depicts another embodiment of a trench MOSFET structure built on p-type epitaxial layer (P0) formed on top of a N+ substrate. The trench walls are covered by dielectric material such as silicon dioxide that contain permanent positive charge. The trenches in FIG. 4(a) are filled with a silicon Trench Fill Layer (TFL). The TFL can be formed for example by Selective Epitaxial Growth (SEG). As shown in FIG. 4(a) a dielectric material is formed between the p-type region in the TFL layer and the conducting gate material.

The Selective Epi layer P (for example in FIG. 4(a)) can be connected to the P+ (Source contact) in the 3rd dimension (perpendicular to the plane of FIG. 4(a) cross section) as is shown in FIG. 22(a).

The top end of the TFL layer is preferably electrically connected to the source as shown in one embodiment in FIG. 4(b).

FIG. 4(c) depicts another embodiment of trench MOSFET structure built on p-type epitaxial layer (P0) formed on top of a N+ substrate. The trench walls are covered by dielectric material such as silicon dioxide that contain permanent positive charge. The trenches in FIG. 4(c) are filled with a semi-insulating Trench Fill Layer (TFL). The TFL can be formed for example by using SIPOS.

The TFL layer (for example in FIG. 4(c)) can be connected to the Source metal in the 3rd dimension (perpendicular to the plane of FIG. 4(c) cross section). The top end of the TFL layer is preferably electrically connected to the source as shown in one embodiment in FIG. 4(d).

FIG. 5(a) shows another embodiment of a trench MOS transistor which is somewhat similar to that shown in FIG. 4(a), except with trench dielectric layer above silicon surface.

FIG. 5(b) shows another embodiment of a trench MOS transistor similar to that shown in FIG. 4(c) but with trench dielectric layer above silicon surface.

FIG. 5(c) shows another embodiment of a trench MOS transistor which is somewhat similar to that shown in FIG. 5(a), except with a trench source contact.

FIG. 5(d) shows another embodiment of a trench MOS transistor similar to that shown in FIG. 5(b) but with a trench source contact.

FIG. 6(a) shows another embodiment of a trench MOS transistor similar to that shown in FIG. 4(a) but with a N-drift region provided on top of the N+ substrate.

FIG. 6(b) shows another embodiment of a trench MOS transistor similar to that shown in FIG. 4(c) but with a N-drift region provided on top of the N+ substrate.

FIG. 7(a) shows another embodiment of a trench MOS transistor similar to that shown in FIG. 6(a) but with trench depth extending only to the N-drift region.

FIG. 7(b) shows another embodiment of a trench MOS transistor similar to that shown in FIG. 6(b) but with trench depth extending only to the N-drift region.

In the devices shown in FIGS. 5(a-b), 6(a-b) and 7(a-b) the bottom end of a silicon (or semi-insulating) TFL is connected to the drain while the top layer is preferably electrically connected to the source at certain areas of the device (not shown).

FIG. 8(a) shows a sample embodiment of a planar DMOS transistor with semi-insulating TFL layer (such as SIPOS).

FIG. 8(b) shows a planar DMOS transistor similar to that shown in FIG. 8(a) but with an additional surface n-layer and N-drift layer.

FIGS. 9(a), 9(b), and 9(c) show other embodiments of planar DMOS transistors with semi-insulating TFL and conductive gate shield layer formed for example of heavily doped polysilicon layer and is preferably electrically connected to the source potential. The gate shield layer results in reducing gate-drain capacitance Cgd.

It is also worth noting that in the devices shown in FIGS. 8(a-b) and 9(a-c) the bottom end of a semi-insulating TFL is connected to the drain while the top layer is preferably electrically connected to the source at certain areas of the device (not shown).

In the following embodiments another class of new device structures are disclosed that have buried or embedded dielectric layers that contain permanent charges. Layers of dielectric material such as silicon dioxide containing permanent charges are buried inside silicon regions and current conduction occurs along all interfaces of a dielectric layer. In these structures the width of the dielectric layer containing permanent charge can be made very thin (for example 10-100 nm) and therefore more current conduction paths can be formed for the same active area of the device. The current conduction paths are formed by inversion layers created along the interfaces of the buried dielectric layers with p-type silicon region due to the existence of positive permanent charges. Such structures therefore offer the significant advantage of reduced $R_{SP}$. Such structures can be fabricated for example using techniques such as Selective Epitaxial Growth (SEG) and permanent charges formed, for example, by using implanted Cesium ions.

FIG. 10(a) depicts one such embodiment of a trench gate MOSFET with buried dielectric layers that contain positive permanent charges. In the on-state electron current flows from the n+ source through the MOS channel to the n-region underneath the trench gate oxide and then through the inversion layers along the dielectric layer interface with silicon created due to the permanent charges. In FIG. 10(a) the doping of regions P0 and P1 can be the same or different.

FIG. 10(b) shows another embodiment of a trench gate MOSFET similar to that shown in FIG. 10(a) except that there is an additional n layer located on top of the N+ substrate.

FIG. 10(c) shows another embodiment of a trench gate MOSFET similar to that shown in FIG. 10(a) except that there is an additional shield layer of conductive material such as doped polysilicon located below the gate electrode to reduce Cgd. The shield layer is preferably electrically connected to the Source potential.

FIG. 10(d) shows another embodiment of a trench gate MOSFET similar to that shown in FIG. 10(b) except that the n regions below the trench gated overlap.

FIG. 10(e) shows another embodiment of a trench gate MOSFET similar to that shown in FIG. 10(c) except that the n regions below the trench gated overlap.

Figure 11A:
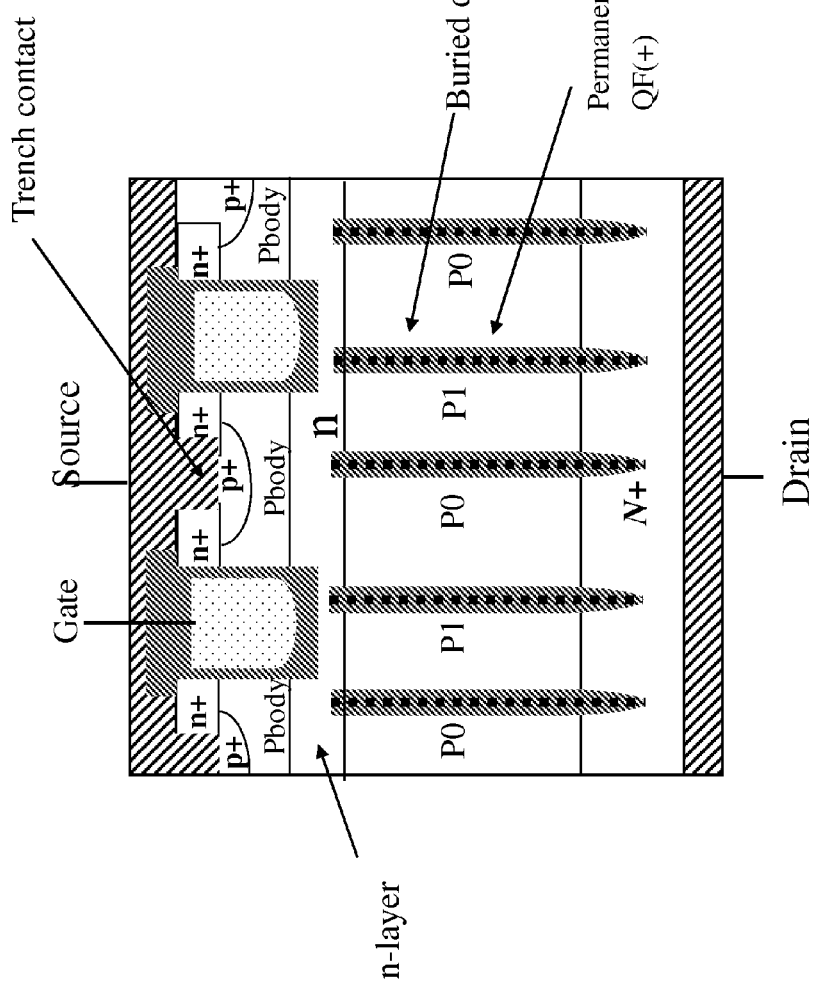
Figure 15L:
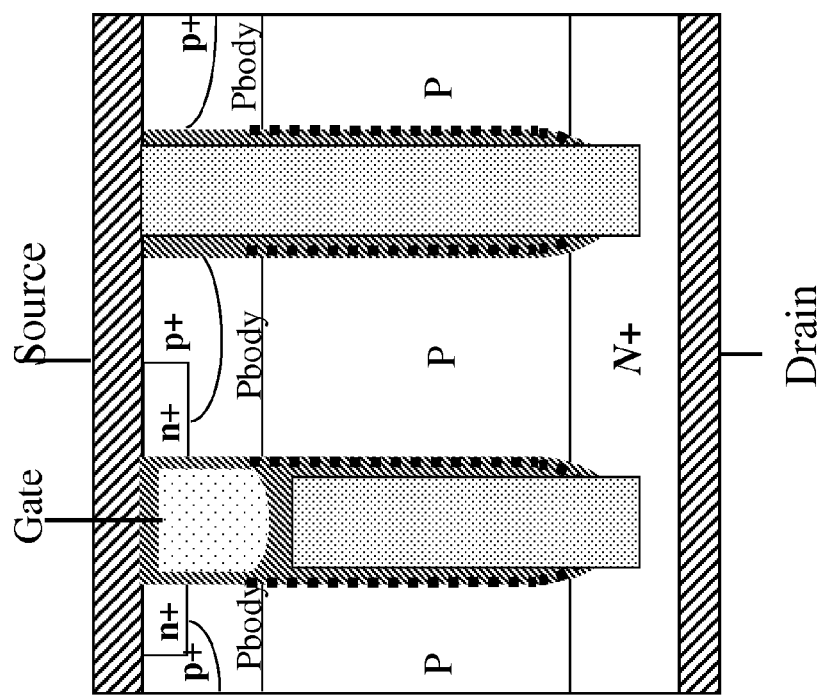

FIG. 11(a) depicts another embodiment of a trench gate MOSFET with buried dielectric layers that contain positive permanent charges with a continuous n-layer below the trench gate and using a trench source contact.

Note that the original epitaxial doping and mesa width can be different from those of the Selective epi layer. A particularly advantageous case is when the product of doping x width of both is equal.

Note that, in FIG. 11(a), the buried layers including charge can be misaligned to the surface geometry.

FIG. 11(b) shows another embodiment of a trench gate MOSFET similar to that shown in FIG. 11(a) except that there is an additional shield layer of conductive material such as heavily doped polysilicon located under the gate electrode that reduces Cgd. The shield layer is preferably electrically connected to the Source potential.

FIG. 11(c) shows another embodiment of a trench gate MOSFET similar to that shown in FIG. 11(b) except that some of the buried dielectric layers contact the trench gate dielectric.

FIGS. 12(a), 12(b), and 12(c) show various embodiments of planar DMOS transistors with buried dielectric layers that contain positive permanent charges. Similarly the buried dielectric layers provide lower RSP since more current conduction paths are formed by the inversion layers along the edges of the buried layers due to the existence of permanent charges.

FIGS. 13(a) and 13(b) show various other embodiments of planar DMOS transistors with buried dielectric layers that contain positive permanent charges and shield layers.

It should be noted that in FIGS. 11(a), 11(b), 11(c), 12(a), 12(b), 12(c), 13(a) and 13(b) that the P epitaxial layer can be connected to the P+ (Source contact) in the 3rd dimension.

FIG. 14 shows another embodiment of a quasi-vertical device where the N+ substrate is replaced by an N+ buried layer formed on top of a P-substrate. The N+ buried layer forms the drain of the device and can be connected to a surface drain contact through a N+ deep sinker or a trench filled with conductive material such as tungsten (not shown). The advantage of this embodiment is that the device can be integrated monolithically with other components such as CMOS, Bipolar transistors, resistors, capacitors, etc.

FIGS. 10-14 show that the buried dielectric layers at various locations with respect to the source and gate. The buried dielectric layers can be placed such that the device performance is optimized.

FIGS. 15(a)-15(l) show one possible process flow to fabricate trench gate MOSFET that contain trenches with SIPOS TFL that contain permanent charge.

FIGS. 16(a)-16(e) show a variation to the previous flow that includes trenches filled with an epitaxial silicon TFL.

FIGS. 17(a-d) show one possible flow of fabricating buried dielectric layers that contain permanent charges. The remaining steps to fabricate a MOSFET transistors such as shown in FIG. 11(a-c) or 12(a-c) are conventional and known to those familiar with the art.

Figure 18:
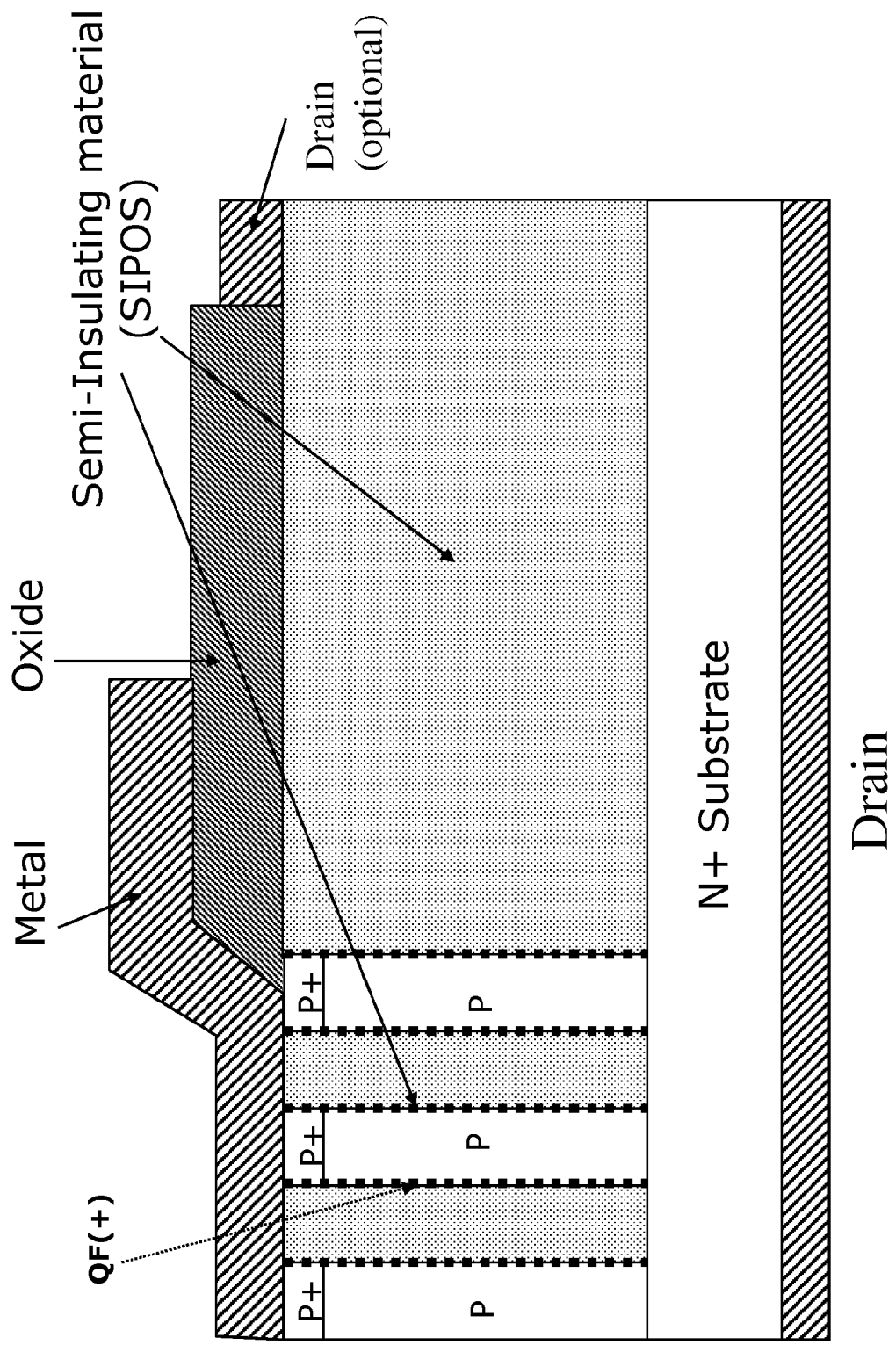
FIGS. 18 and 19 show various termination structures which combine synergistically with the above device embodiments.

FIG. 18 shows an embodiment where a wider trench is filled with semi-insulating material such as SIPOS is used. The trench edge can be optionally contacted by a conducting material such metal connected to the drain potential.

Figure 19:
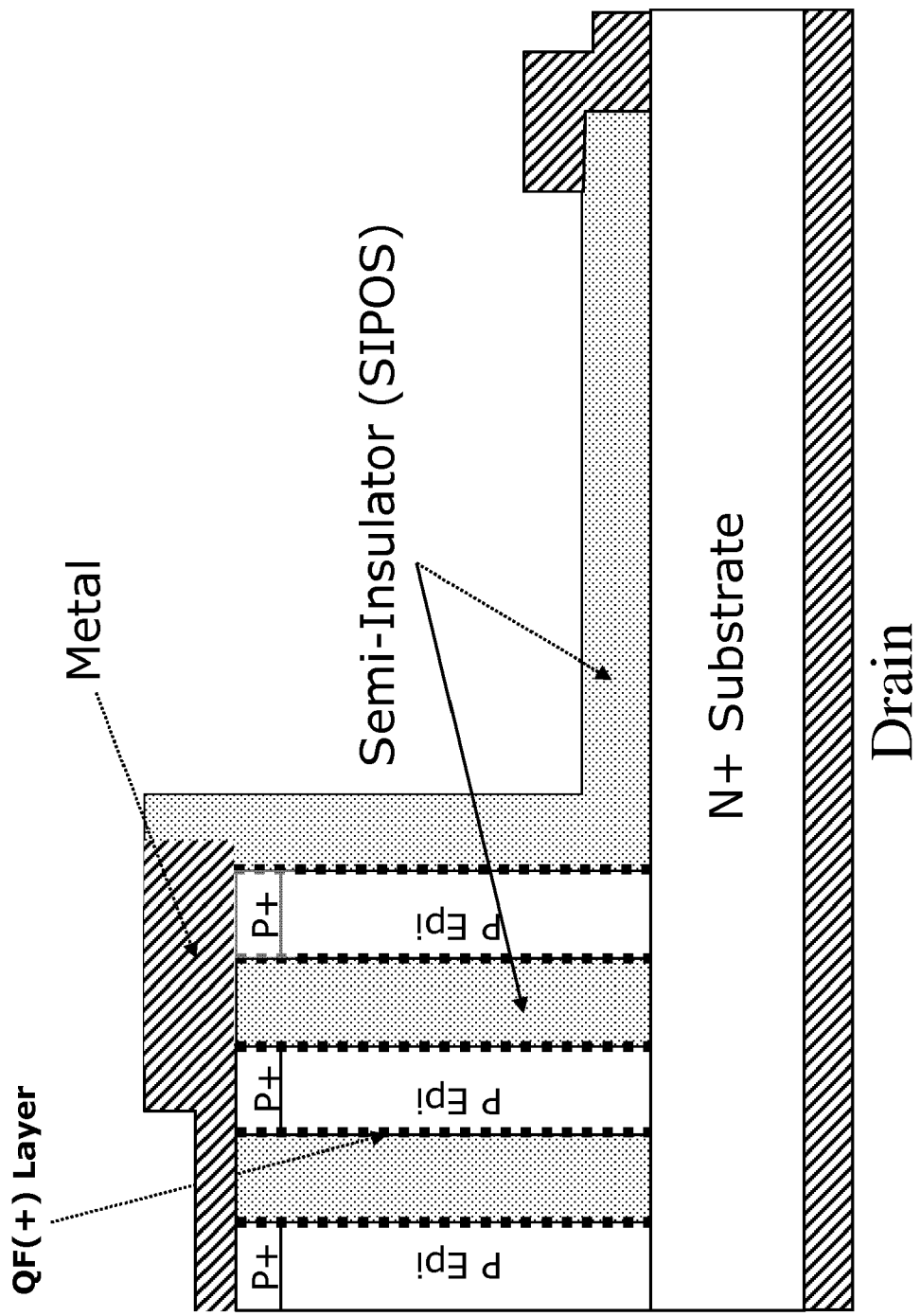

FIG. 19 shows another termination embodiment where is the wide trench the SIPOS layers is contact with the N+ substrate and the termination trench is not completely filled. The SIPOS layer can be covered by an insulating material such as oxide (not shown).

Figure 20:
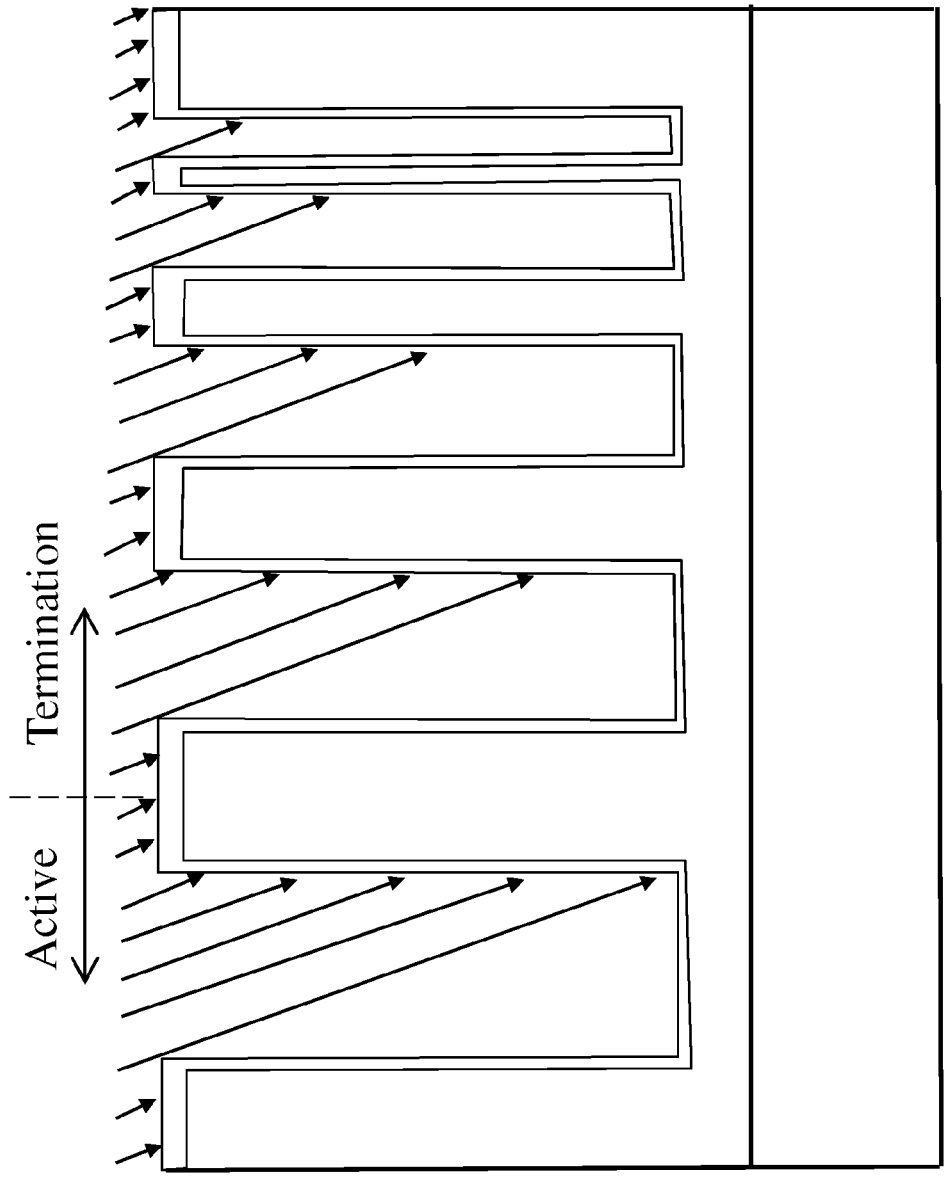

A high voltage edge termination for a device may also be simultaneously fabricated. A gradually decreasing charge depth is obtained by forming openings having decreasing width as the distance from the active area increases. Since the atoms that provide the charge in the oxide sidewall may be implanted, choice of the implant angle to just reach the bottom of the widest trench also results in implanting the atoms to a depth that is less than that of the trench for any trench having a smaller width, as shown in FIG. 20. The spacing between trenches may also be adjusted to provide the charge balance required the breakdown voltage, as also shown in FIG. 20.

The layout of the trenches used for the termination region may vary greatly while achieving the same result. Two such layouts are shown in FIG. 21. FIG. 21(a) shows the use of long, rectangular trenches along the immediate edges of the active region, while circular trenches having different sizes are used in the corner.

FIG. 21(b) shows the use of circular trenches having different sizes along the entire perimeter of the device. Other trench shapes may also be used, such as squares, hexagons, octagons, ovals, and irregular shapes, as long as the charge balance requirements are met.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way. Both cellular and interdigitated surface geometries are well known to one of ordinary skill in the art.

While only diodes and MOSFET transistors are shown here, other devices such as IGBTs or JFETs can also be realized using techniques which are known by those of ordinary skill in the art.

While only n-channel MOSFETs are shown here, p-channel MOSFETs are realizable with this invention simply by changing the polarity of the permanent charge and swapping n-type and p-type regions in any of the figures. This is well known by those of ordinary skill in the art. It is also understood that this invention is also valid if the opposite polarity of the permanent charge i.e. negative charge and the semiconductor materials types are used.

It should be noted in the above drawings the positive permanent charge was drawn for illustration purpose only. It is understood that the charge can be in the dielectric (oxide) layer, at the interface between the silicon and oxide, inside the silicon layer or a combination of all these cases.

The examples of Trench Fill Layer most discussed above are Selective Epitaxial Growth (SEG) or Semi-Insulating-Poly-Silicon (SIPOS). Of course, the conduction properties of the trench fill layer will be affected by the choice of the TFL (and of its deposition conditions). For example, semiconductor material formed by Selective Epitaxial Growth will often have a higher level of crystal defects than a normal epitaxial starting structure. As the SIPOS example shows, the material inside the trenches does not have to be the same as the original semiconductor material.

It should also be understood that numerous combinations of the above embodiments can be realized. \While only diodes and MOSFET transistors are shown here, other devices such as IGBTs, JFETs can also be realized using techniques which are known by those of ordinary skill in the art.

For another example, integrated structures can be built using a deep trench contact or a sinker diffusion, as mentioned above. In such cases a frontside drain contact can be made to the sinker diffusion.

While only n-channel MOSFETs are shown here, p-channel MOSFETs are realizable with this invention simply by changing the polarity of the permanent charge and swapping n-type and p-type regions in any of the figures. This is well known by those of ordinary skill in the art. It is also understood that this invention is also valid if the opposite polarity of the permanent charge i.e. negative charge and the semiconductor materials types are used.

Additional general background, which helps to show variations and implementations, may be found in the following U.S. and PCT applications, all of which, and all their priority applications, are hereby incorporated by reference: WO/2008/039459, US20080073707, US20080191307, US20080164516, US20080164518, US20080164520, US20080166845, WO02009/102684; US20090206924, WO/2009/102651, US20090206913, US20090294892, Ser.

Nos. 12/431,852; 12/394,107; 12/432,917; 12/431,005; 12/369,385; 12/545,808; 12/626,523; 12/626,589. Applicant reserves the right to claim priority from these applications, directly or indirectly or even earlier applications, in all countries where such priority can be claimed.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising:
    a current-controlling structure at a first surface of a semiconductor mass;
    a semiconductive drift region extending down into said semiconductor mass; said current-controlling structure and said drift region being jointly connected in series between a first source/drain region at said first surface, and a second source/drain region which is not connected to said first source/drain region; and
    trenches extending down into said semiconductor mass, at least some of said trenches being at least partially filled with a trench-filling material which is not an insulator, and which is electrically separated from said drift region and electrically connected to said second source/drain region.

2. The device of claim 1, wherein permanent electrostatic charge is present at sidewalls of said trenches.

3. The device of claim 1, wherein said trenches are lined with a dielectric layer which contains immobile cesium ions.

4. The device of claim 1, wherein the device is unipolar, and said first source/drain region is a source.

5. The device of claim 1, wherein the device is a diode, and said first source/drain region is a cathode.

6. The device of claim 1, wherein said semiconductor mass is a Group IV semiconductor.

7. The device of claim 1, wherein said mass is a die of crystalline semiconductive material.

8. The device of claim 1, wherein said trench-filling material is a semiconductive material.

9. The device of claim 1, wherein said trench-filling material is made of the same semiconductive material as said drift region.

10. The device of claim 1, wherein said trench-filling material is a doped crystalline semiconductive material.

11. The device of claim 1, wherein said trench-filling material is a semiconductive material grown by selective epitaxy.

12. The device of claim 1, wherein said trench-filling material is a semiconductive material which has approximately the same doping as said drift region.

13. The device of claim 1, wherein said trenches are generally shaped as linear slots, and said trench-filling material is semiconductive, and wherein the volumetric doping density of said trench-filling material, times the width of said trenches, is approximately equal to the volumetric doping density of said drift region, times the distance between adjacent ones of said trenches.

14. The device of claim 1, wherein said second source/drain region is connected as an anode.

15. The device of claim 1, wherein said trench-filling material is at least partly insulated from said drift region.

16. The device of claim 1, wherein said trench-filling material is completely insulated from said drift region.

17. The device of claim 1, wherein said trench-filling material extends down to contact said drift region directly.

18. The device of claim 1, wherein said trench-filling material is at least partly insulated from said drift region, and not insulated from said second source/drain region.

19. A semiconductor power device, comprising:
    a layered semiconductor structure which includes at least an upper semiconductor portion and a lower semiconductor portion;
    said upper portion including a current-controlling structure, and said lower portion including a drift region; said current-controlling structure and said drift region being jointly connected in series between a first source/drain region at said first surface, and a second source/drain region; and
    trenches extending down into said semiconductor structure, at least some ones of said trenches being at least partially filled with a trench-filling material which is not an insulator, and which is electrically separated from said drift region and electrically connected to said second source/drain region.

20. The device of claim 19, wherein said lower portion is a crystalline semiconductor substrate, and said upper portion is an epitaxial layer on said substrate.

21. The device of claim 19, wherein said trenches are lined with a dielectric layer which includes immobile cesium ions.

22. The device of claim 19, wherein the device is unipolar, and said first source/drain region is a source.

23. The device of claim 19, wherein said trench-filling material is at least partly insulated from said drift region.

24. The device of claim 19, wherein said trench-filling material is completely insulated from said drift region.

25. The device of claim 19, wherein said trench-filling material is at least partly insulated from said drift region, and not insulated from said second source/drain region.

26. The device of claim 19, wherein said trench-filling material extends down to contact said drift region directly.

27. A semiconductor power device, comprising:
    a current-controlling structure at a first surface of a semiconductor mass;
    a semiconductive drift region extending down into said semiconductor mass;
    said current-controlling structure and said drift region being jointly connected in series between a first source/drain region at said first surface, and a second source/drain region at a second surface of said semiconductor mass; and
    trenches extending down through said drift region into said semiconductor mass, at least some ones of said trenches being at least partially filled with a trench-filling material which is not an insulator, and which is electrically connected to said second source/drain region;
    said trenches and said current-controlling structure having completely independent lateral alignment.

28. The device of claim 27, wherein said trenches and said current-controlling structure have different respective pitches.

29. The device of claim 27, wherein permanent electrostatic charge is present at sidewalls of said trenches.

30. The device of claim 27, wherein said trenches are lined with a dielectric layer which includes immobile ions.

31. The device of claim 27, wherein the device is unipolar, and said first source/drain region is a source.

32. The device of claim 27, wherein the device is a diode, and said first source/drain region is a cathode.

33. The device of claim 27, wherein said semiconductor mass is a Group IV semiconductor.

34. The device of claim 27, wherein said mass is a die of crystalline semiconductive material.

35. The device of claim 27, wherein said trench-filling material is a semiconductive material.

36. The device of claim 27, wherein said trench-filling material is made of the same semiconductive material as said drift region.

37. The device of claim 27, wherein said trench-filling material is a doped crystalline semiconductive material.

38. The device of claim 27, wherein said trench-filling material is a semiconductive material grown by selective epitaxy.

39. The device of claim 27, wherein said trench-filling material is a semiconductive material which has approximately the same doping as said drift region.

40. The device of claim 27, wherein said trenches are generally shaped as linear slots, and said trench-filling material is semiconductive, and wherein the volumetric doping density of said trench-filling material, times the width of said trenches, is approximately equal to the volumetric doping density of said drift region, times the distance between adjacent ones of said trenches.

41. The device of claim 27, wherein said second source/drain region is connected as an anode.

* * * * *